US006577130B1

(12) United States Patent
Adamo et al.

(10) Patent No.: US 6,577,130 B1
(45) Date of Patent: *Jun. 10, 2003

(54) SYSTEM AND METHOD FOR SENSING AND CONTROLLING POTENTIAL DIFFERENCES BETWEEN A SPACE OBJECT AND ITS SPACE PLASMA ENVIRONMENT USING MICRO-FABRICATED FIELD EMISSION DEVICES

(75) Inventors: Richard Cosmo Adamo, Palo Alto, CA (US); Victor Manuel Aguero, Menlo Park, CA (US)

(73) Assignee: SRI International, Menlo Park, CA (US)

(*) Notice: Subject to any disclaimer, the term of this patent is extended or adjusted under 35 U.S.C. 154(b) by 90 days.

This patent is subject to a terminal disclaimer.

(21) Appl. No.: 09/707,779

(22) Filed: Nov. 7, 2000

Related U.S. Application Data
(60) Provisional application No. 60/208,346, filed on May 31, 2000.

(51) Int. Cl.[7] .............................................. G09G 3/10
(52) U.S. Cl. ................................. 324/348; 315/169.3
(58) Field of Search ............................ 315/3.6, 111.91, 315/169.3, 169.1, 111.81; 324/464, 348, 357, 410, 72

(56) References Cited

U.S. PATENT DOCUMENTS

| | | | |
|---|---|---|---|
| 3,755,704 A | 8/1973 | Spindt et al. ............... 313/309 |
| 3,789,471 A | 2/1974 | Spindt et al. ............... 29/25.17 |
| 4,097,010 A | 6/1978 | Colombo et al. ........... 244/158 |
| 4,824,051 A | 4/1989 | Engelking ................ 244/158 R |
| 4,923,151 A | 5/1990 | Roberts et al. ............. 244/158 |
| 4,926,056 A | 5/1990 | Spindt ....................... 250/423 |
| 5,132,597 A | 7/1992 | Goebel et al. .............. 315/344 |
| 5,321,336 A | 6/1994 | Cirri ............................ 315/14 |
| 5,676,873 A | 10/1997 | Takase et al. ............... 219/761 |
| 5,847,407 A | 12/1998 | Lucero et al. ................ 257/10 |
| 5,977,696 A | 11/1999 | Okamoto .................... 313/309 |
| 6,064,156 A | 5/2000 | Patterson et al. ........ 315/111.91 |
| 6,116,544 A | 9/2000 | Forward et al. ......... 244/158 R |
| 6,147,456 A | 11/2000 | Janning ................... 315/169.3 |
| 6,153,978 A | 11/2000 | Okamoto ................. 315/169.3 |
| 6,173,922 B1 | 1/2001 | Hoyt et al. .................. 244/150 |
| 6,177,629 B1 | 1/2001 | Katz ........................... 136/292 |
| 6,215,242 B1 | 4/2001 | Janning ....................... 313/495 |
| 6,260,808 B1 | 7/2001 | Bodeau et al. .............. 244/173 |

FOREIGN PATENT DOCUMENTS

| | | | |
|---|---|---|---|
| WO | WO 98/48089 | 10/1998 | ............ D02G/3/00 |

OTHER PUBLICATIONS

A. Pedersen et al., "Methods For Keeping A Conductive Spacecraft Near The Plasma Potential", Proceedings of the 17th ESLAB Symposium on Spacecraft/Plasma Interactions and their Influence on Field and Particle Measurements, Noordijk, The Netherlands, Sep. 13–16, 1983. (ESA SP–198, publ. Dec. 1983).

(List continued on next page.)

Primary Examiner—Christine K. Oda
Assistant Examiner—Vincent Q. Nguyen

(57) ABSTRACT

A sensor and method for measuring an electrical potential difference are described. The sensor includes a micro-fabricated field emission device situated in a space plasma environment. The field emission device has an emitter terminal and a gate terminal. A voltage source applies a voltage across the gate and the emitter terminals to induce current to flow from the emitter terminal A first current monitor measures current flowing from the emitter in response to the applied voltage. A second current monitor measures current flowing to the gate. A control system correlates applied voltages and measured gate and emitter currents with electrical potential differences between the field emission device and the space plasma environment. The control system obtains the gate and emitter currents from the current monitors. A processor computes a value from the gate and emitter current measurements based on a predetermined functional relationship.

28 Claims, 16 Drawing Sheets

OTHER PUBLICATIONS

P. M. Philips et al., "Development of Spindt Cathodes for High Frequency Devices and Flat Panel Display Applications", Part of the 4$^{th}$ International Conference on Millimeter and Submillimeter Waves and Applications, San Diego, Jul. 1998, SPIE vol. 3465.

Journal of Applied Physics, Jun. 1968, vol. 39, No. 7, pp. 3504–3505, "A Thin–Film Field–Emission Cathode," C.A. Spindt.

"Spacecraft Potential Control With Electron Emitters," by R. Grard, A. Gonfalone, and A. Pedersen, European Space Agency, Noordwijk, The Netherlands, pp. 159–169, Presented as Paper SM–127F at the Spring Annual Meeting of the American Geophysical Union, Washington, D.C., Jun. 16–19, 1975.

"Characteristics Of A Volcano Field Ion Quadrupole Mass Spectrometer," by William A. Berth and Charles A. Spindt, *International Journal of Mass Spectrometry and Ion Physics*, 25 (1977), Elsevier Scientific Publishing Company, Amsterdam—Printed in The Netherlands, pp. 183–198.

"The Application Of Thin–Film Field–Emission Cathodes To Electronic Tubes," by I. Brodie and C.A. Spindt, *Applications of Surface Science* 2 (1979), North–Holland Publishing Company, pp. 149–163.

"Spacecraft mass spectrometer ion source employing field emission cathodes," by C. C. Curtis and K. C. Hsieh, *Physics Department, University of Arizona, Tucson, Arizona 85721* (Received Nov. 5, 1985; accepted for publication Jan. 21, 1986) 1986 American Institute of Physics pp. 989–990.

"Field–Emitter Arrays for Vacuum Microelectronics," by C.A. Spindt, C. E. Holland, A. Rosengreen, and Ivor Brodie, *IEEE Transactions on Electron Devices vol. 38, No. 10, Oct. 1991*, pp. 2355–2363.

"Microfabricated field–emission and field–ionization sources," by C.A. Spindt, *SRI International, Menlo Park, CA 94025, USA*, Surface Science 266 (1992) North–Holland pp. 145–154.

"Transient Potential Modification of Large Spacecraft Due to Electron Emissions," by Sven G. Bilen, Victor M. Aguero, and Brian E. Gilchrist, *University of Michigan, Ann Arbor, Michigan 48109* and W. John Raitt, *Utah State University, Logan Utah 84322, Journal of Spacecraft & Rockets*, vol. 34, No. 5, Sep.–Oct. 1997, pp. 655–661.

"Current collection at the shuttle orbiter during TSS–1R high voltage charging," by V.M. Aguero, S.D. Williams, B.E. Gilchrist, L. Habash Krause, D.C. Thompson, W.J. Raitt, W.J. Burke, and L.C. Gentile, Reprinted from *Geophysical Research Letters*, vol. 25, No. 5, Mar. 1, 1998, pp. 729–732.

"Current collection at the shuttle orbiter during the tethered satellite system tether break," by V.M. Aguero, W.J. Burke, B.E. Gilchrist, N.H. Stone, L.C. Gentile, S.D. Williams, D.L. Cooke, D.C. Thompson, C. Bonifazi, and J.P. Lebreton, *Journal of Geophysical Research*, vol. 104, No. A1, pp. 105–114, Jan. 1, 1999.

"Electrical Charging Of Space Platforms At Low Earth Orbit Altitudes," by W.J. Raitt, D.C. Thompson, B.E. Gilchrist, and V.M. Aguero, *Center for Atmospheric and Space Sciences, Utah State University, Logan Utah, 84322, USA; Space Physics Research Laboratory, University of Michigan, Ann Arbor, Michigan 48109, USA; SRI International, Menlo Park, California, 94025, USA, Adv. Space Res.*, vol. 24, No. 8, pp. 1051–1025, Published by Elsevier Science Ltd. 1999 COSPAR.

"Current Collection Model Characterizing Shuttle Charging During the Tethered Satellite System Missions," by V.M. Aguero, B.E. Gilchrist, S.D. Williams, W.J. Burke, L. Krause, L.C. Gentile, Reprinted from *Journal of Spacecraft and Rockets*, vol. 37, No. 2, Mar.–Apr. 2000, A publication of the American Institute of Aeronautics and Astronautics, Inc., pp. 212–217.

Electrodynamic Tether Propulsion—Advanced Space Transportation Program—Space Transportation, http://stp.msfc.nasa.gov/astp/tethers_electetherprop.html, printed Jul. 17, 2000 (5 pages).

"Review of Electrodynamic Tethers for Space Plasma Science," by Peter M. Banks, Stanford University, Stanford, California, Jul.–Aug. 1989 *Electrodynaic Tethers For Space Plasma Science*, vol. 25, No. 4, pp. 234–239.

"The Shuttle Electrodynamic Tether System (SETS) on TSS–1," by V. Aguero et al., *Il Nuovo Cimento*, vol. 17C, No. 1, Jan.–Feb. 1994, pp. 49–65.

Tethers Unlimited, Inc. Newsletter, vol. 3, No. 1, Whole Issue 4, Apr. 2000, Joel Davis, Editor, pp. 1–4.

SYSTEM AND METHOD FOR SENSING AND CONTROLLING POTENTIAL DIFFERENCES BETWEEN A SPACE OBJECT AND ITS SPACE PLASMA ENVIRONMENT USING MICRO-FABRICATED FIELD EMISSION DEVICES

RELATED APPLICATION

This application claims the benefit of the filing date of U.S. Provisional Application, Ser. No. 60/208,346, filed May 31, 2000, entitled "Use of Spindt Cathode Field Emission Arrays in Space-Based Applications" the entirety of which provisional application is incorporated by reference herein.

BACKGROUND

Interactions between spacecraft and a space plasma environment can cause large electrical potential differences to develop between spacecraft structures and the space plasma environment. If uncontrolled, the charging of the spacecraft can produce enhanced surface contamination, increased power leakage currents, and electrical arcs that cause system performance degradation or failure.

Currently available spacecraft charging detection and measurement instruments include floating potential probes, charged-particle energy spectrum analyzers, and electrostatic surface potential monitors. Active charge control techniques include thermionic electron emitters, neutral gas release systems, and plasma generators. A typical charge control device is generally referred to a plasma contactor. This device employs an electrically driven hollow cathode system to ionize and then release an expendable gas such as argon, xenon, or krypton from an onboard gas supply tank. The resulting plasma cloud, which is generated essentially at the spacecraft's potential, allows charged particles of the appropriate polarity to flow to the ambient plasma environment, thus reducing the absolute spacecraft potential.

Disadvantages with this type of charge control device include the weight and complexities associated with the gas storage and mechanical gas flow control subsystem and the time limits placed on operating by the finite gas supply. Also, to maximize system effectiveness and prevent the unnecessary use of gas, a separate supplementary charging monitor system is required to determine when to turn the plasma contactor on and off. Thus, there remains a need for a system and method for controlling charge on a spacecraft without the disadvantages of the devices described above.

SUMMARY OF THE INVENTION

One objective of the invention is to provide a charge emitter that is suitable for use in space applications, i.e., a charge emitter that is lightweight, small in size, and reliable and robust in the space plasma environment. Another objective is to provide a charge emitter capable of emitting low levels of charge, positive or negative, for controlling the charging of a space object. Another objective is to provide a charge emitter capable of emitting large levels of charge, positive or negative, for use in adjusting the orbit of space objects. Yet another objective is that the charge emitter be capable of emitting charge without requiring high voltages. Still yet another objective is that the charge emitter be capable of emitting electrons without the use of expendable resources.

The invention features a sensor for measuring an electrical potential difference. The sensor comprises a field emission device, situated in an environment, having an emitter and a gate. A voltage source applies a voltage across the gate and the emitter to induce current to flow from the emitter. The magnitude of the applied voltage can be less than 100 volts. A control system in communication with the field emission device obtains measurements of the current flowing from the emitter and of current flowing to the gate. The control system also determines an electrical potential difference between the field emission devise and the environment from the gate current and emitter current measurements.

In one embodiment, the control system comprises a processor that determines the electrical potential difference between the field emission device and the environment from a functional relationship between the gate and emission current measurements. The field emission device can be electrically connected to an object. Accordingly, the electrical potential difference measured by the control system corresponds to an electrical potential difference of the object with respect to the environment. The control system can compute the electrical potential difference from the current measurements. In one embodiment, a table can store correspondences between a functional relationship of the gate and emitter currents and electrical potential differences of the field emission device with respect to the environment. The control system can use this table to determine the electrical potential difference from the current measurements.

In another embodiment, the control system comprises a voltage controller in communication with the voltage source to control the voltage applied by the voltage source between the gate and the emitter. The voltage controller alters the flow of current from the emitter by adjusting the applied voltage so as to maintain the electrical potential difference between the field emission device and the environment at a predetermined voltage.

The gate and the emitter of the field emission device have a spatial relationship that facilitates the determination of the electrical potential difference between the field emission device and the external environment of the field emission device. The spatial relationship of the gate and emitter induces at least a predetermined amount of current to flow to the gate.

In another aspect, the invention features a sensor for measuring an electrical potential difference that comprises a field emission device situated in an environment and having an emitter and a gate. A voltage source applies a voltage across the gate and the emitter to induce current to flow from the emitter. A first current monitor in communication with the emitter measures current flowing from the emitter in response to the applied voltage. A second current monitor in communication with the gate measures current flowing to the gate. A control system in communication with the voltage source and current monitors determines an electrical potential difference between the field emission device and the environment from the gate and emitter current measurements.

In yet another aspect, the invention features a controller for controlling an electrical potential difference of a space object with respect to an environment of the space object. The controller includes a field emission device with appropriate exposure to the environment of the space object. The field emission device has at least two terminals and is electrically connected to the space object. A voltage source applies a voltage across two terminals of the field emission device to induce current obtained from the space object to flow from one of the terminals into the environment of the space object. A control system measures an electrical potential difference between the field emission device and the environment of the space object, based on measurements of currents flowing through the two terminals. The control system alters the flow of the current from the emitting terminal by adjusting the applied voltage so as to control that electrical potential difference.

In still another aspect, the invention features a method for measuring an electrical potential difference. A voltage is applied across a gate and an emitter of a field emission device situated in an environment to induce current to flow from the emitter. Measurements of the emitter current flowing from the emitter and of current flowing to the gate are obtained. An electrical potential difference between the field emission device and the environment is determined from the measured gate and emitter currents. In one embodiment, the applied voltage is adjusted to adjust the emitter current and to maintain the electrical potential difference between the field emission device and the environment at a predetermined voltage. The field emission device can be connected to an object. The determined electrical potential difference thus corresponds to an electrical potential difference of the object with respect to the environment.

In another aspect, the invention features a method for sensing and controlling an electrical potential difference of a space object with respect to an environment of the space object. An at least two-terminal field emission device has appropriate exposure to the environment of the space object and is electrically connected to the space object. A voltage is applied across two terminals of the field emission device to induce charge obtained from the space object to flow from one of the terminals into the environment of the space object. An electrical potential difference is measured between the field emission device and the environment of the space object based on currents that are measured in response to the applied voltage. The flow of the charge from the emitting terminal is altered by adjusting the applied voltage, to control the electrical potential difference between the space object and the environment of the space object.

BRIEF DESCRIPTION OF THE DRAWINGS

The invention is pointed out with particularity in the appended claims. The advantages of the invention described above, as well as further advantages of the invention, may be better understood by reference to the following description taken in conjunction with the accompanying drawings, in which:

DESCRIPTION OF THE INVENTION

Figure 1:
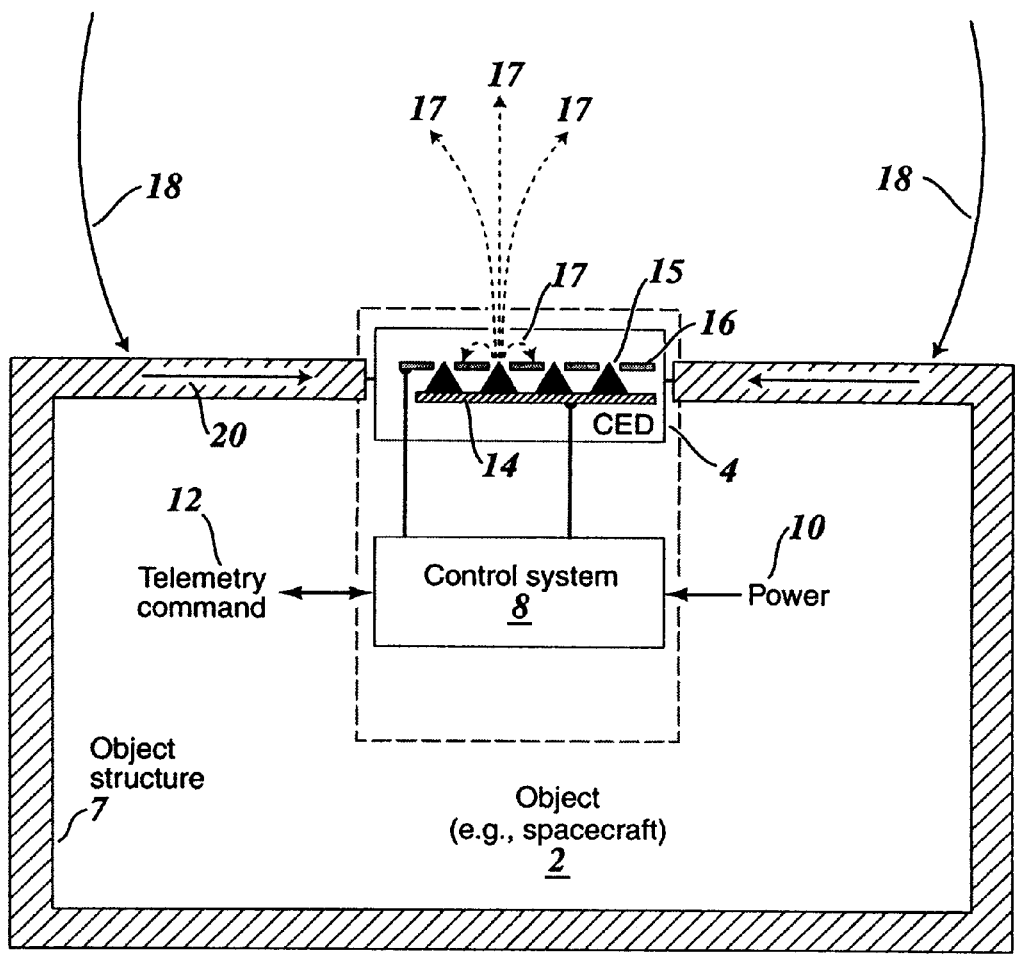
FIG. 1 is a diagram of an embodiment of a system for measuring and controlling the electrical potential difference between an object and the ambient space plasma environment in accordance with the principles of the invention, the system including a charge-emitting device having a gate and an array of emitter tips.

FIG. 1 shows an embodiment of a system 1 for measuring and controlling the local electrical potential difference between a space object 2 and an external ambient space plasma environment 6 in accordance with the principles of the invention. In one embodiment, the space object 2 is a spacecraft such as a space probe, a satellite, a solar panel array, a space telescope, a space shuttle, a space station or platform, or other space structures. In other embodiments, the space object 2 is an object located in a near vacuum (e.g., in a vacuum chamber). The space object 2 can be in orbit around the Earth or other celestial bodies (i.e., low-earth orbit, geo-synchronous orbit, or polar orbit), or be in transit through interstellar space. The space object 2 has a structure (or frame) 7 that is exposed to or surrounded by the ambient space plasma environment 6.

The system 1 includes an electrically controllable charge-emitting device 4 in communication with a control system 8. The charge-emitting device 4 is mounted to the object structure 7 and includes two terminals. As shown, one of the terminals is a gate terminal (gate) 16 and the other terminal is a charge-emitting terminal (emitter) 14. In one embodiment, the gate 16 is physically mounted flush with the external surface, but is electrically isolated from the external surface by the control system 8. The gate 16 and an associated voltage with respect to the charge emitting terminal 14 are used to control emission of charge from the charge-emitting device 4. Accordingly, the charge-emitting device 4 is also referred to as a gated charge-emitting device.

The charge-emitting terminal 14 includes a plurality of emitter tips 15 from which electric charge 17 emanates through the gate terminal 16 to the space plasma environment 6. Some of the emitted charge 17 returns to the gate 16. The emitted charge 17 can have a positive or negative polarity, depending in part upon the bias of the voltage applied across the two terminals of the charge-emitting device 4. The charge-emitting device 4 emits the charge 17 under the control of the control system 8.

The control system 8 has an internal reference ground connection to the object structure 7, and receives power 10 from an internal power supply (not shown) capable of providing an adequate bias voltage (typically less than 100V between the emitter 14 and the gate 16). The control system 8 also receives telemetry and command signals 12. Such signals 12 can originate from ground control or another space vehicle. In some embodiments, the control system 8 may be as simple as a voltage between the emitting terminal 14 and the gate 16 resulting from the interaction of the object 2 and object components and the space plasma environment 6. Thus, the voltage naturally provided by such interactions can drive the charge emitted by the charge-emitting device 4.

Usually, the object 2 interacts within the ambient space plasma environment 6 such that charge 18 builds on the object structure 7. The charge build-up causes a potential difference to form between the object 2 and the ambient space plasma environment 6. Typically, the nature of such interactions with the environment 6 causes the object 2 to become negatively charged with respect to the space plasma environment 6. In one embodiment, the charge-emitting device 4 draws a current 20 comprised of the negatively charged electrons from the structure 7 and emits the electrons as a current 17 into the ambient space plasma environment 6.

Depending-upon the rate of emitting the electrons into the environment 6, the charge-emitting device 4 can lower (i.e., make less negative) or maintain the negative potential difference between the object 2 and its environment 6. In another embodiment, the charge-emitting device 4 is configured to emit positively charged ions into the ambient space plasma environment 6, which increases the negative potential difference between the object 2 with respect to its environment 6.

Under other circumstances, the object 2 can become positively charged with respect to that environment 6. For such situations, the charge-emitting device 4 can be configured to emit positive ions into the ambient space plasma environment 6, to lower (i.e., make less positive) or maintain the positive potential difference between the object 2 and its environment 6. Alternatively, the charge-emitting device 4 can be configured to emit electrons or negatively charged ions into the ambient space plasma environment 6, and to increase thereby the positive potential difference between the object 2 with respect to its environment 6.

For each of the above-described embodiments, the space plasma environment 6 provides a near vacuum through which the charge 17 can propagate away from the charge-emitting device 4, and consequently from the object 2 itself.

Field Emission Device

Figure 2:
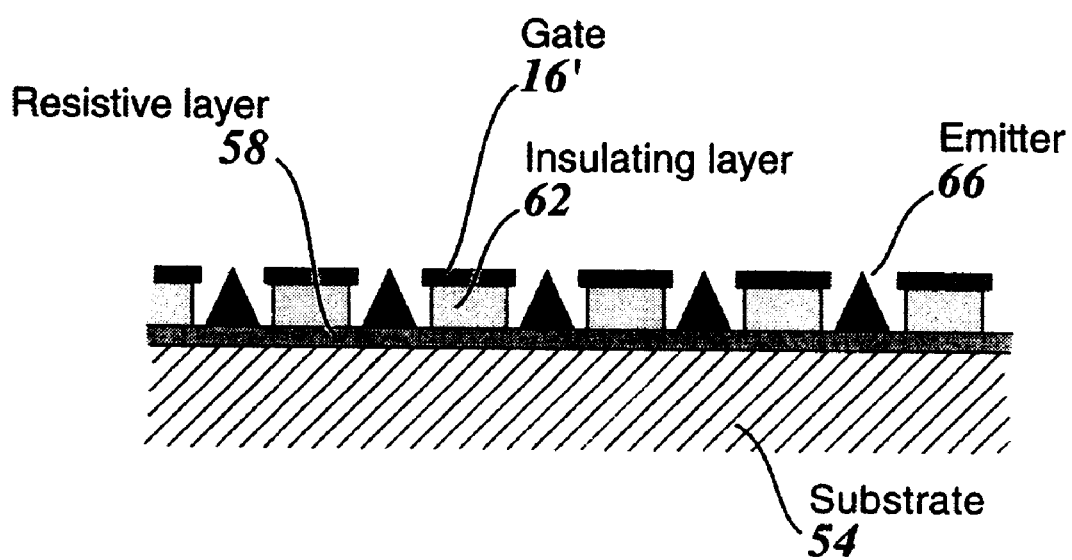
FIG. 2 is a partial cross-section of an embodiment of a field emission device, which is a particular embodiment of the charge-emitting device of FIG. 1.

Referring to FIG. 2, one particular embodiment of the charge-emitting device 4 is an electron field emission device array 50 having a gate 16' and an array of emitters 66. Throughout the specification, electron field emission device arrays are interchangeably referred to as field emission devices.

One embodiment of the field emission device 50 suitable for practicing the principles of the invention is a Spindt cathode device, manufactured by SRI International of Palo Alto Calif. and described in U.S. Pat. No. 3,789,471, issued to Spindt et al, on Feb. 5, 1974. In general, the current emission level of the field emission device 50 is controlled by adjusting the voltage of the gate 16' relative to the tips of the emitters 66. Because of the small scales of geometry of the gate 16' and emitters 66, operating voltages for controlling current emission from each emitter tip 66 range typically between 50 volts and 100 volts. Operating voltages beyond 100 volts can be used. Thus, the field emission device 50 has an advantage of being efficient at generating electrons while requiring low electrical power. More specifically, applying an operating voltage above a threshold induces the emitter tips 66 to emit electrons, and further increasing this voltage causes an increase in the emitted current. Another advantage of the field emission device 50 is that the device 50 operates cleanly, i.e., without contaminants associated with thermionic emission from electron guns or the flow of ionization gas associated with plasma contactors, such as a hollow cathode device.

The field emission device 50 is fabricated on a substrate 54 that is typically, but not limited to, a dielectric (e.g., silicon) or an insulator (e.g., glass). The substrate 54 may include an upper resistive layer 58 (e.g., 100 ohms-cm) to improve uniformity of emission from the emitters 66 in the array 50. Although a higher drive voltage becomes necessary to achieve comparable emission current, the resistive layer 58 provides significant failure protection on a emitter tip by tip basis and increases field emission device reliability and emitter tip longevity in the space plasma environment 6.

An insulating layer 62, typically a semiconductor oxide, (e.g., silicon dioxide) covers the substrate 54 (or the resistive layer 58).

A conducting film (e.g., molybdenum) coats the insulating layer 62. This conducting film can be a metal, a resistive material, or a semiconductor. An array of holes (or cavities) is etched through the conducting film and the insulating layer 62 to the substrate 54 (or to the resistive layer 58) using semiconductor manufacturing techniques. The conducting film remaining after the etching of the holes forms the gate 16' of the field emission device 50.

Emitters 66 comprised of conducting material,(e.g., molybdenum) are formed in the holes. Devices have been built with up to approximately $10^2$ emitters 66 per square centimeter, but this is not an upper limit. In one embodiment, the base of each emitter 66 is on the dielectric substrate 54 (or on the resistive layer 58) and the tip of each emitter 66 (i.e., the emitter tip) is in the plane of the gate 16'. The tip aspect ratio, its length and width, and the shape can be designed to tailor the characteristics of the device 50. For those embodiments having a resistive layer 58, each emitter tip behaves effectively as if in series with a resistor.

The small scale of the individual emitter tips causes the array 50 to be sensitive to the chemistry of the environment 6 in which array 50 operates. Consequently, when a benign environment is not guaranteed, non-reactive coatings or materials may be desirable to reduce susceptibility to degradation caused by surface chemistry and absorbates. A commonly used tip material is molybdenum, which is known to be reactive with atomic oxygen, a primary chemical species in the low-orbit plasma environment surrounding the Earth. Molybdenum tips have proved rugged and have survived atmospheric exposure and operation in many gas environments. Other tip materials can be considered, such as silicon carbide, titanium, and chromium. Tip coatings can also have a secondary benefit of reducing gate voltage needed to emit a certain current level.

The process for fabricating field emission devices 50 can be modified to produce field emission devices incorporating other selected materials, insulators, and geometries. For example, wedge-shaped emitter arrays can be formed using cavities that are slots instead of holes.

Figure 3:
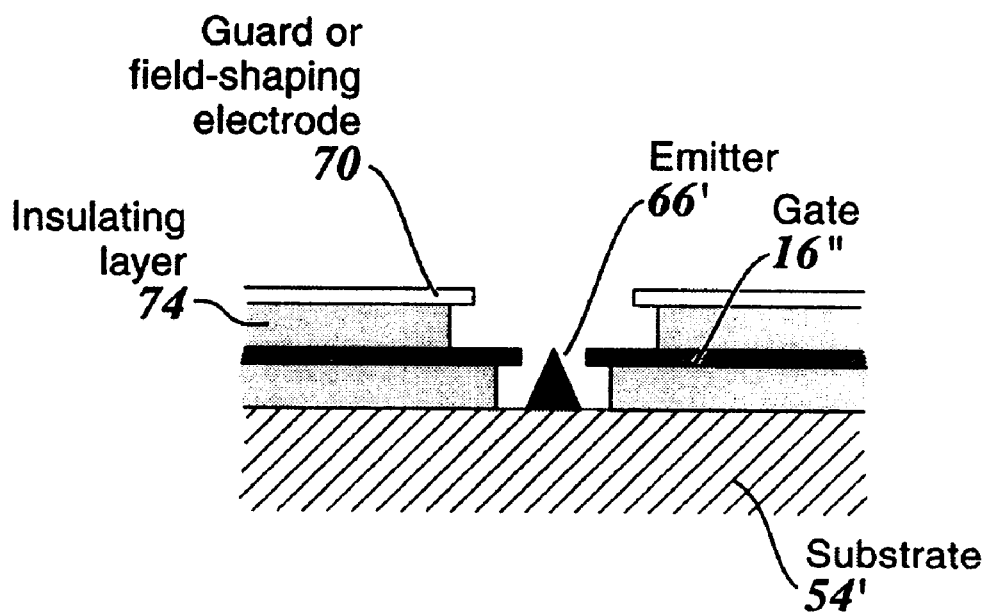
FIG. 3 is a partial cross-section of another embodiment of the field emission device.

As another example, FIG. 3 shows a geometric variation in which another electrode 70 has been added to the structure of FIG. 2 (without a resistive layer 58) to form a multi-electrode structure. The electrode 70 is formed from a conducting layer that covers an insulating layer 74 deposited on the gate 16''. The electrode 70 modulates or controls the beam emitted by emitter 66' by shaping the trajectories of the emitted electrons or serving as an additional integrated gate. Moreover, the additional guard electrode 70 can be used to allow more precise gate current measurements by shielding the gate 16'' from the external plasma environment 6.

Another example of a geometric variation is to alter the relative position of the tip of the emitter 66 with respect to the gate 16'. By shortening the height of the emitters 66 so that the tip of each emitter 66 is below the plane of the gate 16', and consequently further from the cavity opening, more current emitted from the emitter tip flows to the gate 16' and not to the plasma environment 6. This geometric variation can also be used to allow more precise gate current measurements by increasing the gate current to a measurable amount.

Figure 4:
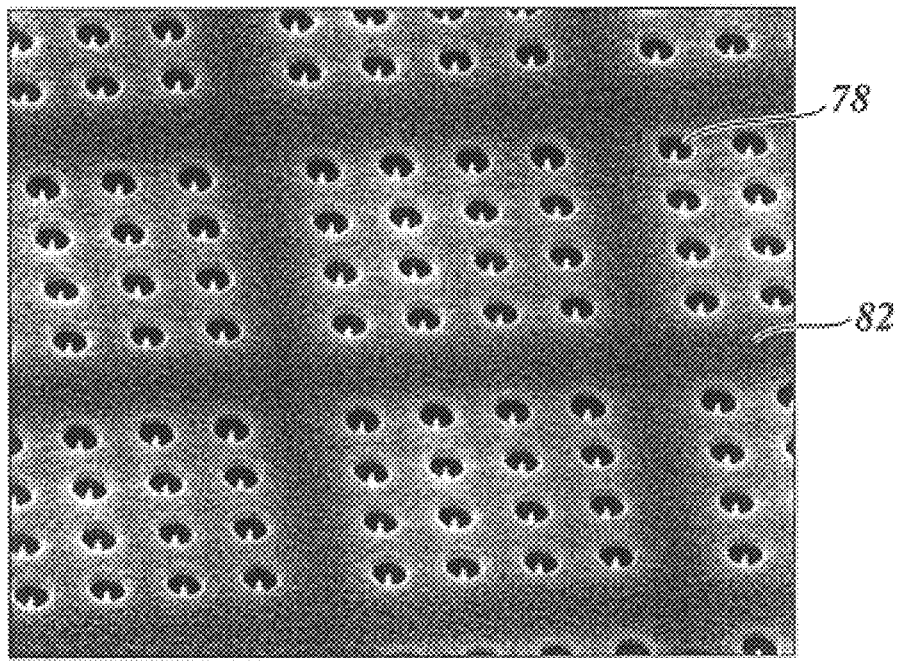
FIG. 4 is a top view of an embodiment of the field emission device.

FIG. 4 shows a top view of an embodiment of the field emission device 50 fabricated on a single integrated circuit (IC) 82 and having an exemplary arrangement of cavities 78 within which the emitter tips 66 reside. Current fabrication capabilities can produce the IC 82 having a packing density of $5 \times 10^7$ emitter tips/cm$^2$. With each emitter tip 66 having a tested capability of emitting 100 $\mu$A, the IC 82 can conceivably produce 5000 amps/cm$_2$. Further, this type of field emission device 50 has been operated over a temperature range of approximately $-270°$ C. and $900°$ C.

Figure 5:
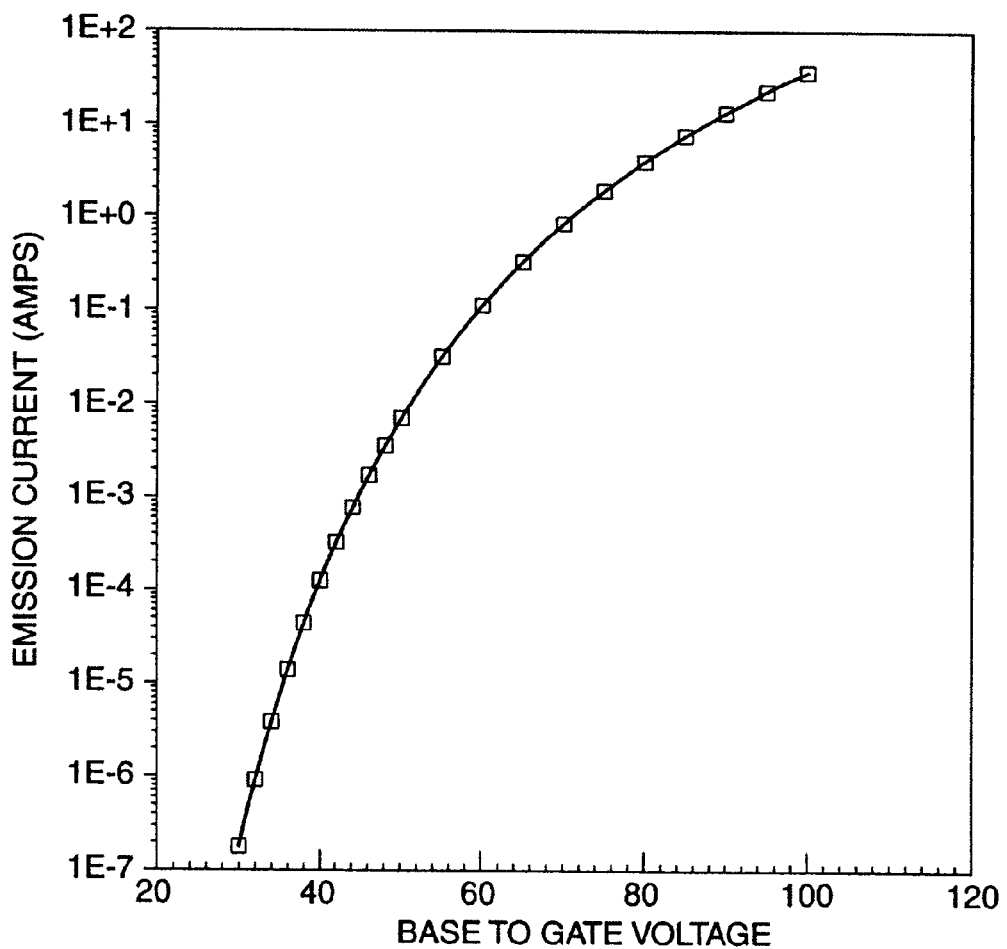
FIG. 5 is a plot of modeled I–V characteristics of one embodiment of the field emission device.

FIG. 5 shows a plot of modeled I–V characteristics of one embodiment of the field emission device 50, i.e., a Spindt cathode device with an array of 5 million emitter tips, for applied voltages between 30 and 100 volts. As shown, the Spindt cathode device can achieve 0.1 amperes of emission current with approximately 60 volts applied between the gate 16 and the base of the emitters. An increase in the gate voltage to approximately 70 volts increases the current emission to approximately 1 ampere. This plot illustrates a characteristic of the Spindt cathode device, and of field emission devices in general, that the gated structure of the device allows low voltages between the gate electrode and emitter tips to control the emission of electrons.

Figure 6:
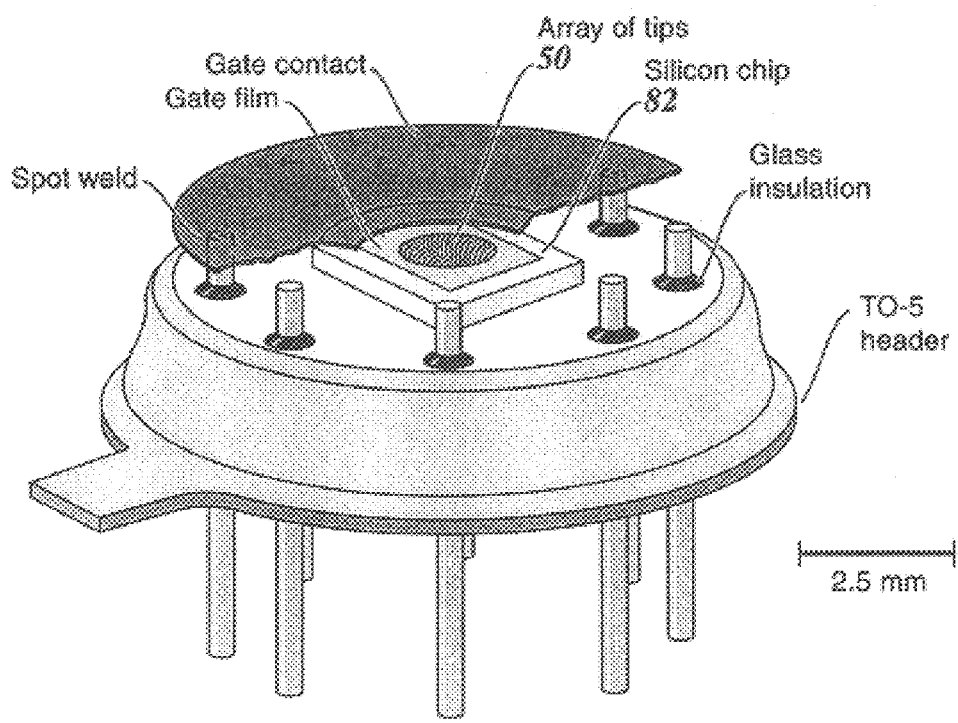
FIG. 6 is a diagram of an embodiment of a component that incorporates the field emission device.

FIG. 6 shows the integrated circuit 82 of FIG. 4, including the field emission device 50, mounted on a standard TO-5 header. As shown, the diameter of the shown embodiment of the standard TO-5 header is approximately 10 mm. Because the field emission device 50 has a large operating temperature range, is lightweight and small in size compared to other electron emitting technologies (e.g., an electron gun), the field emission device 50 is better suited than such emitting technologies for space-based applications.

Figure 7:
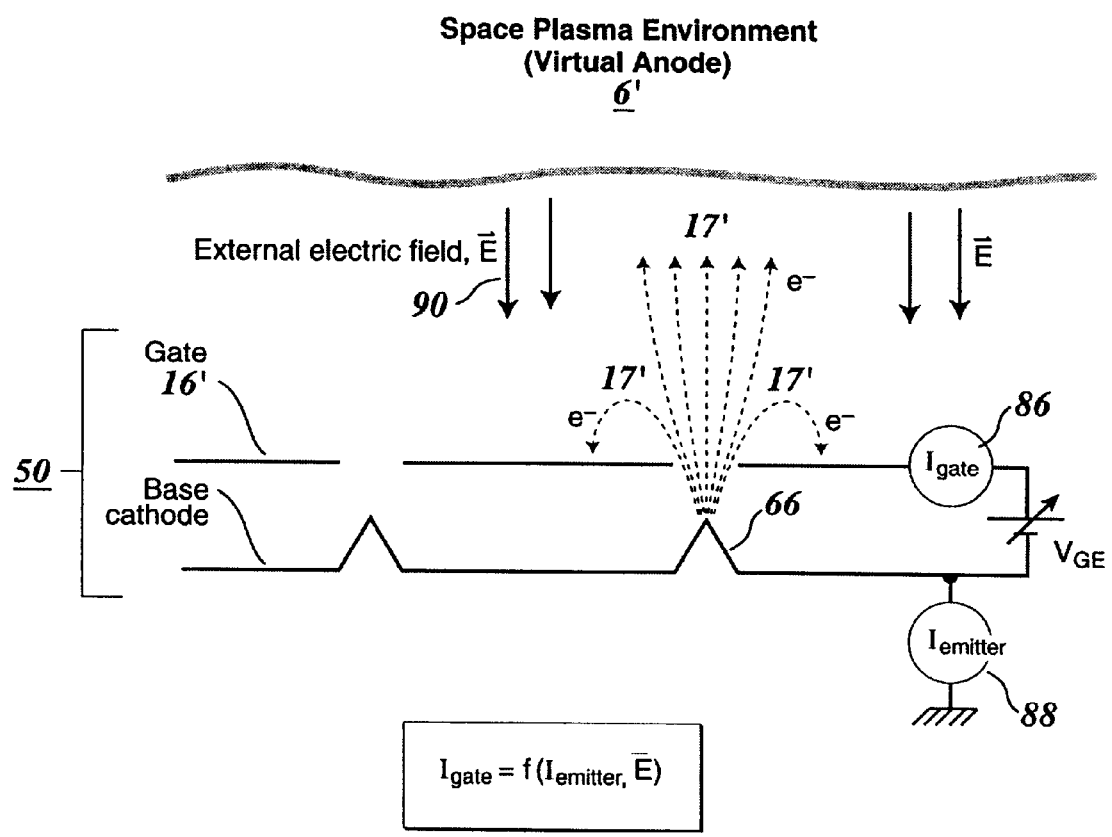
FIG. 7 is a schematic representation of the operation of the field emission device, using space plasma a virtual anode.

FIG. 7 shows an embodiment of a schematic representation of the operation of the field emission device 50 shown in FIG. 2. In this embodiment, the field emission device 50 is located within the space plasma environment 6' and is at a negative potential with respect to that environment 6'. This negative potential difference between the field emission device 50 with respect to the space plasma environment 6' results in an external electric field E. The greater the potential difference, the stronger this electric field E.

A voltage $V_{GE}$ is applied between the gate 16' and the base of the emitter tips 66. Typically, $V_{GE}$ is less than 100 volts, but voltages greater than 100 volts can be used. The applied voltage $V_{GE}$ induces the emitter tips to emit electrons 17'. The rate of emission produces an emitter current, ($I_{emitter}$), which can be monitored by a current monitor 88. Some of the emitted electrons 17 of the emitter current $I_{emitter}$ flow to the space plasma environment 6'; other electrons 17 flow to the gate 16' to contribute to a gate current, $I_{gate}$, which can be measured by a current monitor 86. The gate current is a function of the emitter current and the electric field E ($I_{gate}$=f($I_{emitter}$, E)).

With the applied voltage $V_{GE}$ remaining constant, and consequently the emitter current $I_{emitter}$ remaining constant, if the strength of the electric field E decreases, the current flowing to the gate 16' typically increases. That is, an increasing number of electrons 17' of the emitter current $I_{emitter}$ are typically collected by the gate 16' instead of reaching the space plasma environment 6'.

Conversely, if the strength of the electric field E increases, the number of electrons flowing to the gate typically decreases because an increasing number of the electrons 17' of the emitter current typically pass through the gate 16' to the space plasma environment 6' rather than be collected by the gate 16'. Such devices 50 have been operated continuously and in switched modes where the current flow is varied or cycled on and off at speeds beyond $10^9$ cycles per second.

Field Ionization Device

Figure 8:
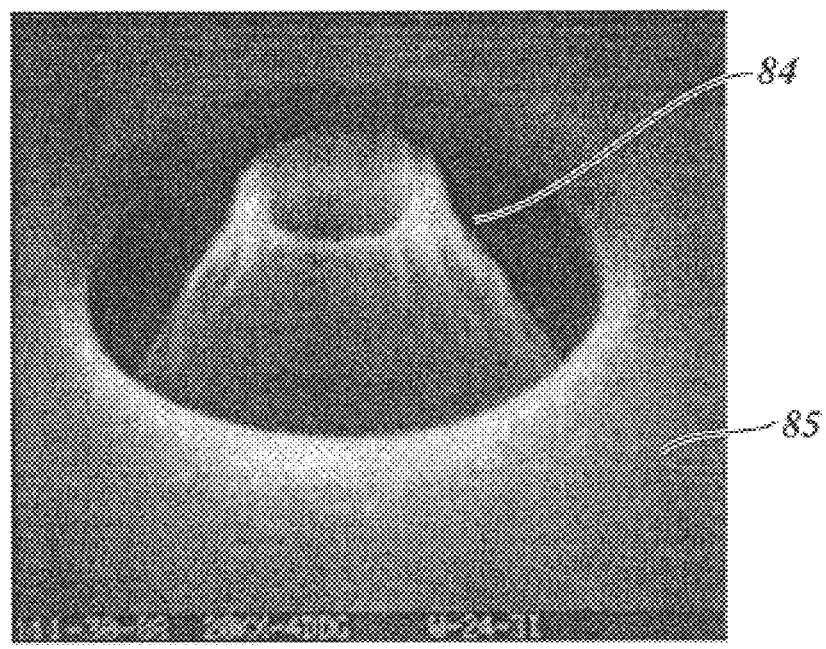
FIG. 8 is a scanning electron microscope image of an embodiment of a field ionization device, which is a particular embodiment of the charge-emitting device of FIG. 1.

Another embodiment of the charge-emitting device 4 is a field ionization device array that emits positive or negative ions. In one embodiment of the field ionization device array, each emitter 66 is configured into the shape of a micro-volcano. FIG. 8 shows a scanning electron microscope image of one such micro-volcano emitter 84 within a hole 85 in the field ionization device array. Expendable gases, liquids, or liquid-metals are supplied through the field ionization device array to-provide a source of positive ions. When the bias voltage across the gate and the micro-volcano emitters is sufficiently negative, field ionization causes positive ions to be released into the space plasma environment 6. Reversing the bias voltage and operating without expendables, the micro-volcano emitters can be induced to release electrons. Accordingly, this embodiment of the charge-emitting device 4 is capable of switching between electron emission and ion emission. An example of a field ionization device array that is suitable for practicing the principles of the invention is described in U.S. Pat. No. 4,926,056, issued to Charles A. Spindt, on May 15, 1990.

Applications of the field emission and field ionization devices described above include (1) charging, discharging, or neutralizing of a space object in space, (2) measuring and controlling the electrical potential differences between the space object and its space plasma environment, (3) measuring and controlling the electrical potential differences between components of the space object, (4) providing electron and ion sources that can be used for charge control and plasma propulsion, and (5) providing a charge source that can be used to adjust the orbit of a space object.

Space Object Charge Control

Controlling the charging of the space object 2 in space has various practical applications, including avoiding charge imbalances that result from photoemission and spacecraft-plasma interactions. For example, photoemission can strongly affect geo-synchronous space objects, space objects in low-density plasma, or large surfaces susceptible to photoemission. Charging of the space object 2 (or various components of the space object 2) can also be the result of other natural phenomena, such as the interactions of the space object 6 with the space plasma. Other sources of charging include charge exchange chemical reactions, electric propulsion systems, plasma currents, etc.

Figure 9:
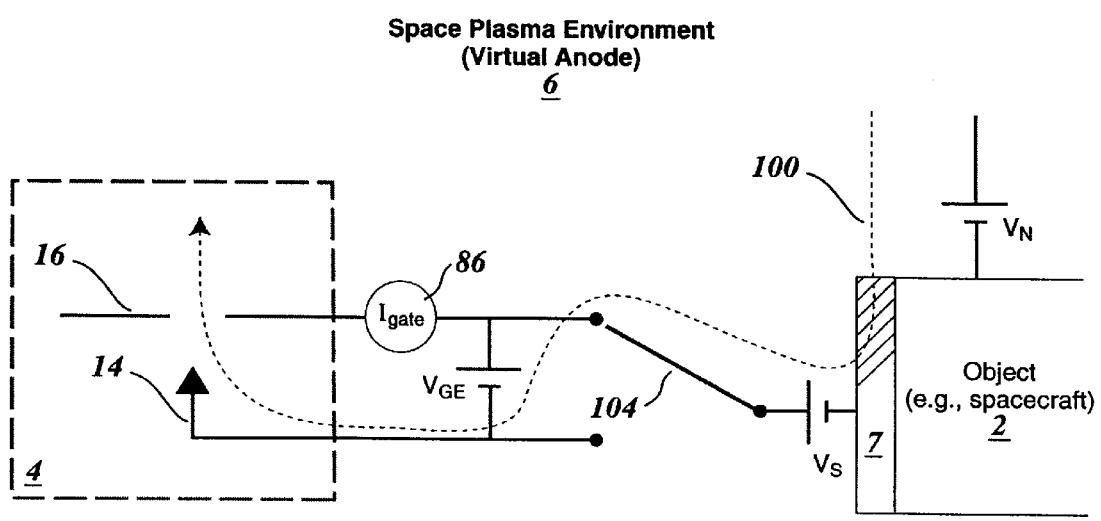
FIG. 9 is a schematic representation of an embodiment of the charge-emitting device of FIG. 1, configured with the gate connected to the structure of the space object.

FIG. 9 shows an embodiment of a schematic representation of the charge-emitting device 4, illustrating the operation of charge-emitting device 4 for controlling the charging of the space object 2 in the space plasma environment 6. Because of the rapid response time of the charge-emitting device 4, such devices can also be used to control and modify charging caused by dynamically changing charge environments. In some environments, charges and electromagnetic fields change at speeds that are not normally referred to as electrostatic.

The gate 16 is maintained at a potential relative to the space object 2 by a low impedance gate current monitoring circuit 86 and voltage source $V_S$. In one embodiment, $V_S$ is zero volts, and consequently the gate 16 is at space object ground potential. Zero volts can be implemented by connecting a conductive wire or a fuse between the gate 16 and the space object 2. In this case, a voltage $V_{GE}$ is applied across the gate 16 and the emitter 14 such that the gate 16 is biased positively relative to the emitter 14, inducing the emitter 14 to emit electrons. As shown in FIG. 9, the emitted electrons follow a path 100 from the ambient space plasma environment 6 to the space object structure 7, through the power supply of $V_{GE}$, and return to the ambient space plasma environment 6.

For example, assume that the potential $V_N$ of the space object structure 7 is significantly negative with respect to the ambient space plasma 6 potential. Consequently, a major portion of the current emitted by the emitter 14, $I_{emitter}$, is accelerated through the gate 16 directly to the external space plasma environment 6. The gate 16 may collect a portion of the emitter current, typically less than 1% of the total emitter current. This current collected by the gate 16 combines with any current that is being drawn to the gate 16 from the space object structure 7 through leakage or from other sources of plasma current, such as ionization. Thus, in this embodiment, $I_{gate}$ is the net sum of the current collected from the emitter and any other sources of ion or electron current that may exist.

The electrons emitted to the ambient space plasma environment 6 cause the structure potential relative to the ambient space plasma to drop (i.e., becomes less negative) and approach the potential of the ambient space plasma, provided the number of emitted electrons exceeds the net amount of negative charge being collected by the space object structure 7. As the difference between the gate 16 (and space object) potential and virtual anode (i.e., ambient space plasma) potential approaches zero, the gate 16 collects an increasing portion of the emitted current.

Conversely, the structure potential relative to the ambient space plasma increases (i.e., becomes more negative) if the net amount of negative charge being collected by the space object structure 7 exceeds the number of emitted electrons emitted to the space plasma environment 6. Further, if the number of electrons emitted to the space plasma environment 6 approximates the net amount of negative charge collected by the space object structure 7, the structure potential relative to the ambient space plasma remains unchanged.

In another example, assume that the potential $V_N$ of the space object structure 7 is significantly positive with respect to the ambient space plasma 6 potential. In this case, the charge-emitting device 4 can be a field ionization device that emits positive ions into the space plasma environment 6. The positive ions emitted to the ambient space plasma environment 6 cause the structure potential relative to the ambient space plasma to drop (i.e., become less positive) and approach the potential of the ambient space plasma, provided the number of emitted positive ions exceeds the net amount of positive charges arriving at the space object structure 7. Again, as the difference between the gate 16 (and space object) potential and virtual anode (i.e., ambient space plasma) potential approaches zero, the gate collects an increasing portion of the emitted positive ions.

Conversely, the structure potential relative to the ambient space plasma increases (i.e., becomes more positive) if the net amount of positive charge arriving at the space object structure 7 exceeds the number of positive ions emitted to the space plasma environment 6. Further, if the number of positive ions emitted to the space plasma environment 6 approximates the net amount of positive ions being collected by the space object structure 7, the structure potential relative to the ambient space plasma remains unchanged.

In still another example, assume that the potential $V_N$ of the space object structure 7 is neutral initially with respect to the ambient space plasma 6 potential. In this case, whether the charge-emitting device 4 emits positive or negative charge into the environment, such emission operates to build a charge on the space object 2. Accordingly, under the direction of the control system 8, the charge-emitting device 4 can establish a potential difference between space object 2 and the space plasma environment 6.

The ability to establish a potential difference between the space object 2 and the space plasma environment 6 can be used to advantage in a number of ways. An example is to bias the space object 2 such that the net naturally occurring current flux to the spacecraft is exactly balanced by the emitted flux. In such a mode of operation, the amount of emitted current would be a measure of the naturally occurring current flowing to the space object 2; that is, when this balance is achieved, the space object 2 itself serves as a current measuring device.

Further, the same charge-emitting device 4 can operate to discharge and charge the space object 2. Such operation occurs under at least two situations. First, in the case of the charge-emitting device 4 that can switch between emitting electrons and ions, such switching itself operates to discharge and charge the space object 2. Second, charge emission from the charge-emitting device 4 can first operate to discharge and neutralize the potential of the charged space object 2, and continued emission thereafter operates to charge the space object 2. For example, if the space object is charged negatively with respect to the plasma environment 6, emitting electrons from the charge-emitting device 4 operates to discharge the space object (i.e., make less negative). Continued emission of electrons, after neutralizing the potential of the space object 2, then operates to charge the space object 2 positively with respect to the space plasma environment 6.

Also, the charge emitting capabilities of the charge-emitting device 4 is such that one such charge-emitting device alone is capable of discharging, charging, and/or neutralizing the space object 2. Although some embodiments of the charge-emitting device 4 can provide more than a hundred milliamperes of current, typically orders of magnitude less current is needed to control the charging of the space object 2. Current limits can be imposed to achieve the desired emission level and prolong the reliable operation of the field emission device 50.

Figure 10:
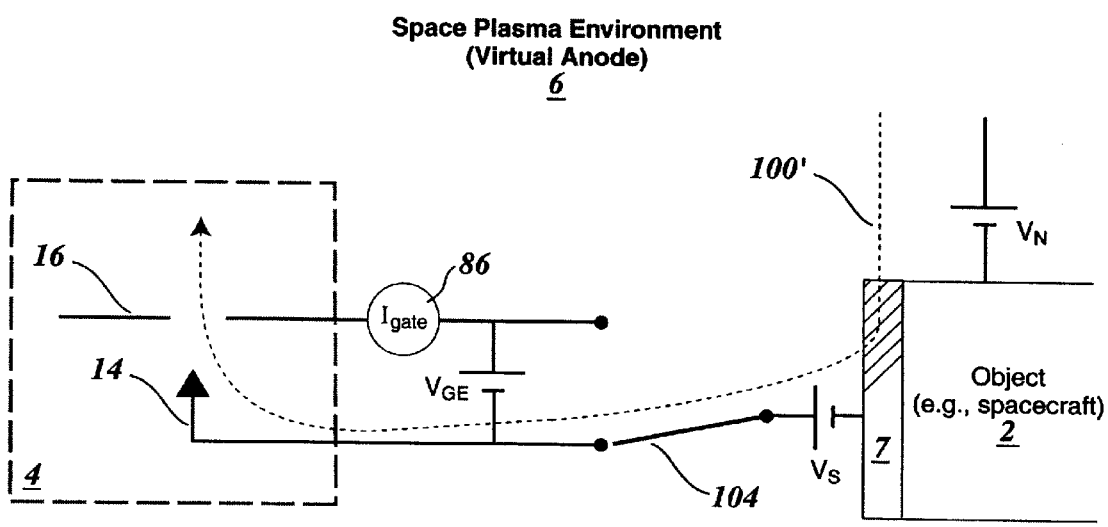
FIG. 10 is a schematic representation of an embodiment of the charge-emitting device of FIG. 1, configured with the emitter array connected to the structure of the space object.

FIG. 10 shows another embodiment of a schematic representation of the charge-emitting device 4 of FIG. 1, illustrating an alternative configuration of the charge-emitting device 4 in the space plasma environment 6. This configuration of the charge-emitting device 4 provides a "low power" operating mode, as described below. In this low power mode, the charge-emitting device 4 can operate without passing the emitted current through the source controlling the gate-to-emitter voltage (i.e., $V_{GE}$). Thus, use of the charge-emitting device 4 for controlling space object charging is not limited to power generating space objects, such as solar panel arrays. In general, in the low power mode, the charge-emitting device 4 is configured to emit charge if the charging of the space object 2 exceeds a certain potential. Thus, here is a passive implementation of charging control.

In this embodiment, if the space object structure is negative with respect to the local space plasma, the emitter 14 is at $V_S$ (or at the space object structure potential when $V_S=0$ volts) and the gate 16 is biased positively ($V_{GE}$) through the onboard power supply or by a naturally occurring voltage difference between the gate 16 and the emitter 14. In this case, only the portion of the emitted current that is recollected by the gate 16 contributes to the system power consumption. (Here, $I_{gate}$ is a measure of the collected current and is sufficiently small to allow operation for years using a simple non-rechargeable battery.) The space object-to-plasma potential difference $V_N$ produced by the naturally occurring charging process supplies the remaining power for extracting and accelerating the available current.

In this embodiment, FIG. 10 shows a path 100' taken by the emitted electrons. As shown, such electrons travel from the space plasma environment 6 to the space object structure 7 and return to the space plasma environment 6 through the emitter 14 without passing through the gate 16 or the voltage source $V_{GE}$.

Further, in this embodiment, by emitting electrons to the space plasma environment 6, the potential of the structure 7 approaches but does not reach the local space plasma potential. The structure potential cannot reach the local space plasma potential because a major portion of the emitted current is redirected to the gate 16 electrode when the local space plasma potential approximates the gate potential.

Although the low-power configuration of the charge-emitting device 4 is described above with respect to the emission of electrons, the principles of this low-power operating mode apply also to the emission of positive ions. The charge-emitting device 4 can operate without emitted current passing through the source controlling the gate-to-emitter voltage (i.e., $V_{GE}$).

In one embodiment, the system 1 includes a switch 104 (shown also in FIG. 9) to enable switching between the gate-grounded configuration of FIG. 9 and the emitter-grounded configuration of FIG. 10. The switching occurs at the direction of the control system 8, and can occur upon receipt of a particular signal or at a preset time or time intervals.

As described above, either configuration can operate to charge or discharge a space object 2. Such charging or discharging can start automatically at a preset time, for example, or when the control system 8 receives a start signal (i.e., from ground-control or another communication device). The charge-emitting device can emit continuously or for limited periods of time as determined by the control system 8. The control system 8 can also control the amount of emitted charge by controlling the amount of time that the charge-emitting device is on and/or by limiting the current that the charge-emitting device can emit when operating.

SENSOR AND CONTROLLER OF POTENTIAL DIFFERENCE

Figure 11A:
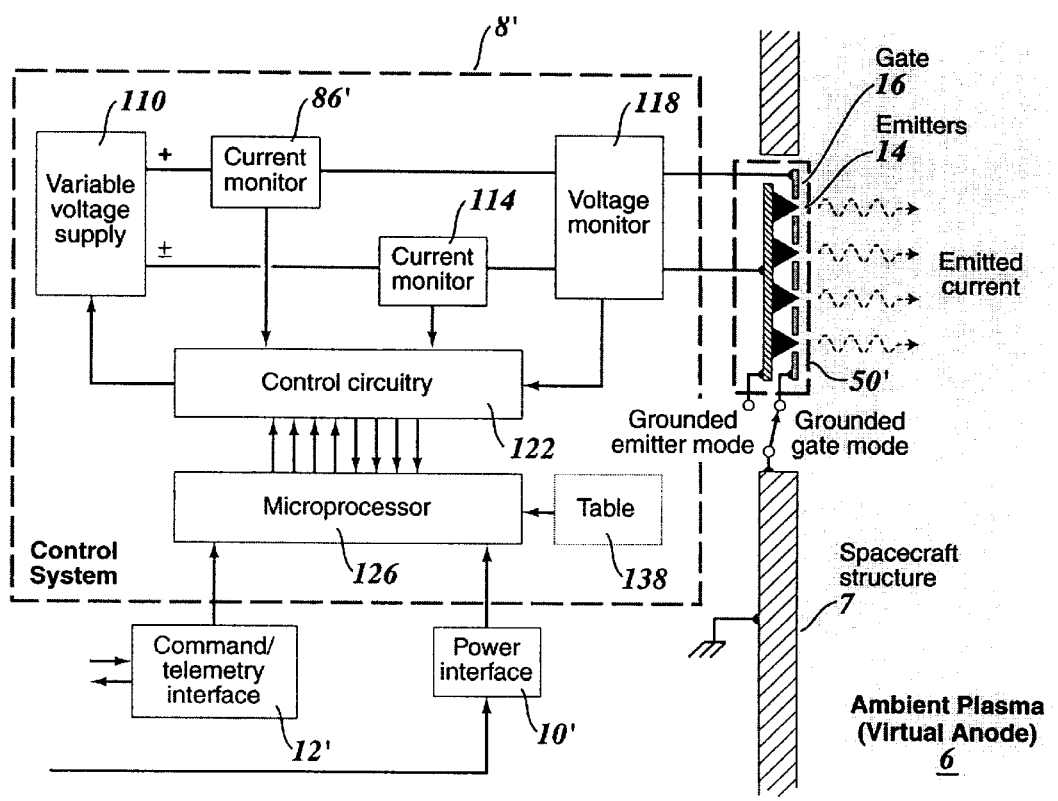
FIG. 11a is a diagram of an embodiment of a sensor for measuring the electrical potential of the space object structure with respect to the ambient space plasma environment.

FIG. 11a shows an embodiment of a sensor 106 for measuring the potential difference of the space object structure 7 with respect to the ambient plasma environment 6. The sensor 106 includes a gated field emission device 50' in communication with a control system 8'. The field emission device 50' can be configured in either the gate-grounded mode described in FIG. 9 or the emitter-grounded mode described in FIG. 10.

The control system 8' includes a variable voltage supply 110, a gate current monitor 86', an emitter current monitor 114, a voltage monitor 118, control circuitry 122, a microprocessor 126, and, optionally, a table 138 or a database. In other embodiments, any combination of the variable voltage supply 110, the gate current monitor 86', the emitter current monitor 114, and the voltage monitor 118 can be external to the control system 8', i.e., as part of other components in the sensor 106, or external to the sensor 106.

The variable voltage supply 110 is in communication with the control circuitry 122 and applies a voltage across the gate 16 and the array of emitters 14 as determined by the control circuitry 122. The gate current monitor 86' is connected between the variable voltage supply 122 and the gate 16, to measure the current flowing to the gate 16, and the emitter current monitor 114 is connected between the variable voltage supply and the emitters 14, to measure the current flowing from the emitters 14, as a result of the applied voltage. The voltage monitor 118 measures the voltage across the gate 16 and emitters 14.

Each of the gate current monitor 86', emitter current monitor 114, and voltage monitor 118 are connected to the control circuitry 122 to provide the respective current and voltage measurements. The control circuitry 122 is in communication with the microprocessor 126 to report the received measurements and to adjust the variable voltage supply 110 according to instructions received from the microprocessor 126. From current measurements received from the control circuitry 122, the microprocessor 126 in one embodiment computes a value corresponding to the electrical potential difference of the space object 2 relative to the space plasma environment. Together, the microprocessor 126 and control circuitry 122 function as a voltage controller of the voltage applied by the variable voltage supply 110, based on inputs from the current monitors 86', 114 and the voltage monitor 118.

Figure 11B:
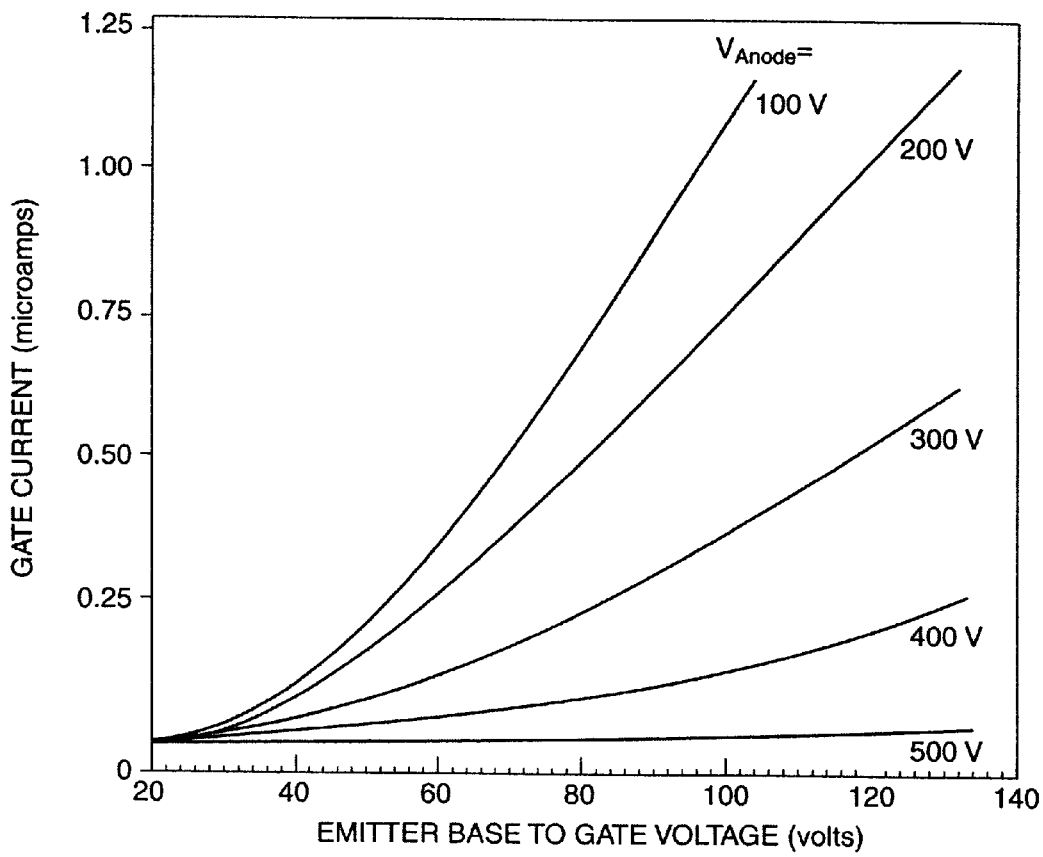
FIG. 11b is a graph representing an exemplary functional relationship between electrical potential differences of the space object to the space plasma environment, the applied voltage, and the measured gate current.

The microprocessor 126 is also in communication with telemetry and commands interface 12', a power interface 10', and, in one embodiment, the table 138. In general, the table 138 maintains a correlation between the measured currents, $I_{gate}$ and $I_{emitter}$, and electrical potential differences of the space object structure 7 with respect to the space plasma environment 6. As a specific example, each entry in the table 138 can include four values: one for each of the measured parameters ($I_{gate}$ and $I_{emitter}$), one value represents a functional relationship between $I_{gate}$, $I_{emitter}$, and the voltage applied between the gate and the emitter (i.e., f($I_{gate}$, $I_{emitter}$, $V_{GE}$)), and the fourth value represents the corresponding electrical potential difference, which has a functional relationship to the measured parameters. In one embodiment, the correlation between the measured currents, $I_{gate}$ and $I_{emitter}$, the applied voltage, $V_{GE}$, and the electrical potential differences of the space object structure 7 with respect to the space plasma environment 6 is empirically determined. FIG. 11b shows a graph representing an example of a functional relationship between electrical potential difference of the space object with respect to the space plasma object, the applied voltage, $V_{GE}$, and the measured gate current, $I_{gate}$. The contents of the table 138 can be communicated to the microprocessor 126 through the telemetry and commands interface 12' or preprogrammed into memory before the space object 2 is placed in the environment 6.

In general, the control system 8' uses three inputs to determine the electrical potential difference between the field emission device 50' and its environment 6: the applied voltage, the measurement of current flowing to the gate, and the measure of current flowing from the emitter. In those embodiments where the field emission device 50' is electrically connected to the space object 2, (such as shown in FIG. 11a), the measured electrical potential difference corresponds to the local electrical potential difference of the space object 2 with respect to the plasma environment 6.

More specifically, the control system 8' biases the field emission device 50' to produce an emitter current and then computes a value corresponding to the functional relationship, which depends on the resulting gate and emitter currents. Resulting gate currents, in general, can be small and consequently difficult to measure and to correlate accurately to an electrical potential difference. Accordingly, in one embodiment the geometry of the gate and emitter of the field emission device are such that the spatial relationship between the gate and emitter induces at least a predetermined amount of current to flow to the gate from the emitter. This minimum amount of current facilitates measuring the current flowing to the gate and increases the resolution for correlating a functional relationship between the gate and emitter currents with an electrical potential difference. If the measured gate current is too high or too low to produce a value that falls within the range of values stored in the table 138, the sensor 106 indicates that the potential difference is either above or below a threshold voltage.

In one embodiment, a charge controller works together with the sensor 106 to discharge and/or charge the space object and to control the electrical potential to a desired target potential. This target potential can be predefined or dynamically determined and communicated to the control system 8' using the telemetry input 12. More specifically, the microprocessor 126 accesses the table 138, using the value computed by the sensor 106, to determine the corresponding electrical potential difference of the space object 2 with respect to the space plasma environment 6. The control system 8' can then monitor the space object potential, and, if desired, dynamically adjust the emission current to maintain the space object 2 at the target potential. Specifically, the microprocessor 126 compares the measured electrical potential difference with the predefined electrical potential difference. If the measured potential difference is more negative than the predefined potential difference, the microprocessor 126 instructs the variable voltage supply 110, through the control circuitry 122, to increase the voltage applied across the gate 16 and emitters 14. The increase in applied voltage increases the current that is emitted from the field emission device 50' and reduces the electrical potential difference (i.e., makes less negative) of the space object structure 7. In other embodiments, the control system 8' can maintain a fixed voltage across the gate 16 and the emitter 14 and thus achieve a fixed emission current level.

Although described above using field-emission devices, the principles of the invention also apply to the use of field-ionization devices for sensing and controlling the electrical potential difference of the space object 2 with respect to the space plasma environment 6.

Figure 12:
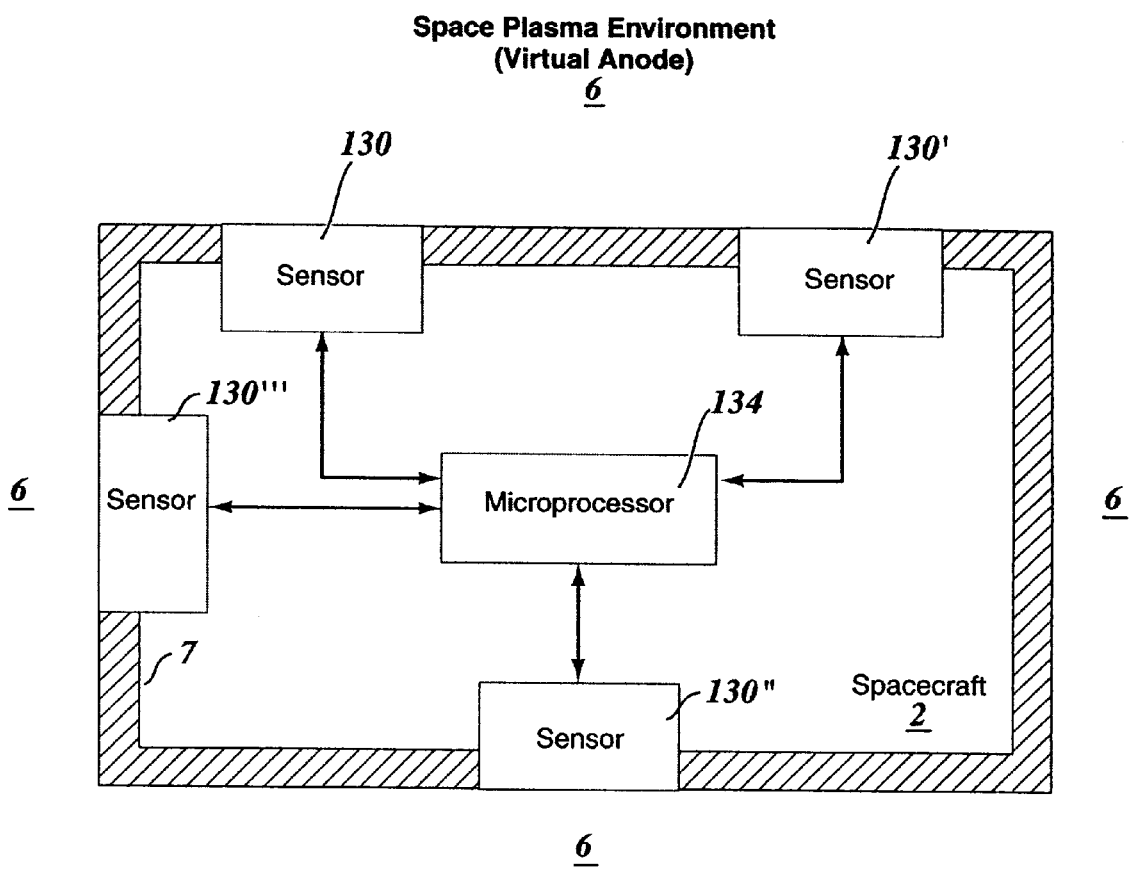
FIG. 12 is a diagram of an embodiment of a system for measuring and comparing the electrical potential of the space object structure with respect to the ambient space plasma environment at various locations on the space object.

Referring to FIG. 12, in one embodiment multiple sensors 130, 130', 130'', and 130''' (generally 130), each operating like sensor 106 described above in FIG. 11a, are placed at various locations on the space object 2. The small size of the field emission device 50' allows flexibility with regard to the placement of the device 50' on the space object 2. The small size also allows many of such devices 50' to be distributed over the frame 7 of the space object 2, thus reducing effective current densities of current emitted into the space plasma environment 6.

Each sensor 130 measures the local electrical potential difference of the space object structure 7 with respect to the plasma environment 6 at the position where that sensor is located. A microprocessor 134 is in communication with each of the sensors 130 to collect the measured local potential differences. From the collected measurements, the microprocessor 134 can measure and report any potential differences forming between components of the space object 2. In one embodiment, the microprocessor 134 can also control this differential charging by controlling the relative current emission rates at each of the sensors 130 to alleviate large levels of electrostatic charging between surfaces of the space object 2.

The sensor 106 (and charge controller) of FIGS. 10 and 11a realize improved sensitivity, response time, and measurement rate, and many magnitude reductions in mass, power, and cost over present space object potential measurement and control devices. The ability to measure local space object potential also enables several unique capabilities not readily accomplished with macroscopic devices. Among these are the ability to (1) determine the current collection by a space object or isolated conducting surface with a single micro-fabricated device, (2) to make measurements without the sheath geometry perturbations caused by typical macroscopic sensors, and (3) to measure differential charging between surfaces without significantly adding to the payload mass or complexity of the space object.

The micro-fabricated nature of the charge-emitting device achieves such improvements, in part, by requiring no expendable resources (e.g., gas) when emitting electrons. Also, an understanding of the basic physical quantities (e.g., gate and emitter currents) associated with the operation of the gated charge-emitting devices provides the underpinnings of the sensor that senses by actively monitoring the performance of the charge-emitting device. Such sensor technology has applicability across various thrust or propulsion technologies, including electric propulsion systems, and sensor and charge control applications of distributed space objects, micro and nano-sciencecraft, and in-space operations. The micro-fabricated nature of the charge-emitting device also allows for new experimental capabilities for small space object, such as the ability to sample and characterize a space object's plasma environment 6 by means of active control of space object potential and measurement of the resulting collected currents.

Adjusting the Orbit of the Space Object

Figure 13:
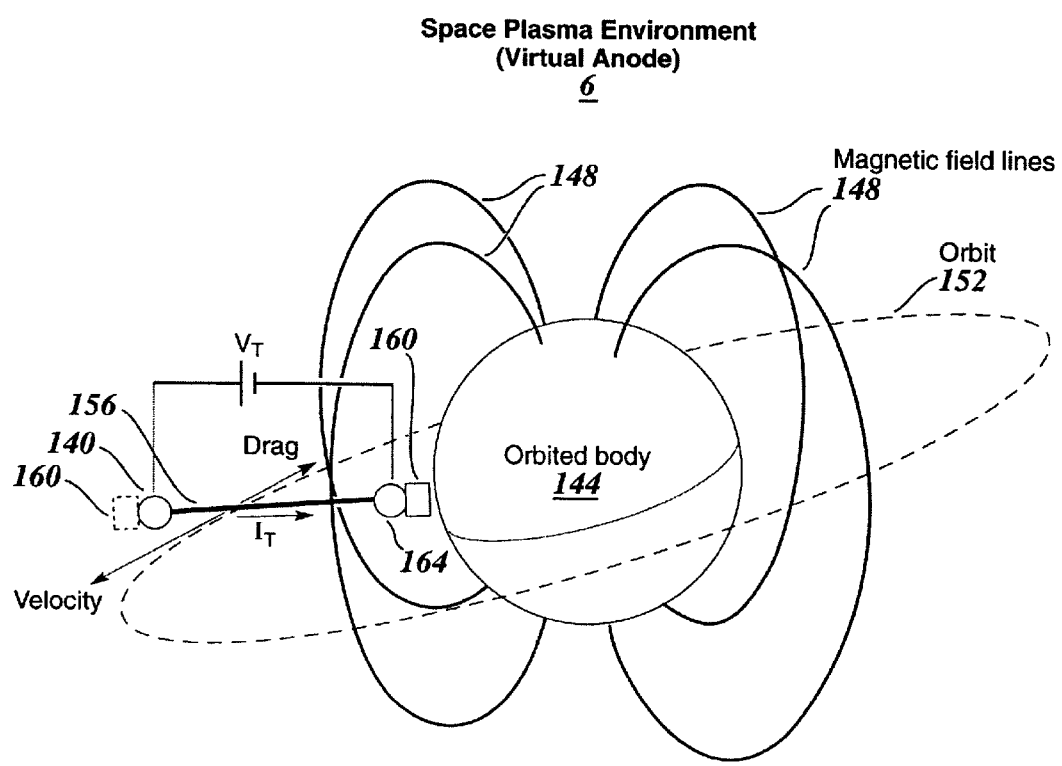
FIG. 13 is a diagram of an embodiment of a system for adjusting the orbit of a space object using an or bit control module in accordance with the principles of the invention.

Another application for gated charge-emitting devices, like those described above, is in adjusting the orbit of orbiting space objects, such as for example satellites. FIG. 13 shows an embodiment of a system for adjusting the orbit of a space object 140 as the space object 140 orbits a body 144 that generates a magnetic field 148 (shown by magnetic field lines). A deployed electrodynamic tether 156 extends from the space object 140 that is to have its orbit adjusted. In general, the electrodynamic tether 156 is a conductive wire connected to an end body 164 that extends for several kilometers from the space object 140, such as, for example electrodynamic tethers developed by Tethers Unlimited, Inc. of Seattle, Wash. The end body 164 contains a deployer mechanism and an orbit control module 160. The location of the deployer mechanism is not limited to the end body 164, and may be located on the space object 2. The gradient of the gravitational field of the orbited object, if sufficiently large, tends to orient the tether 156 in a radial direction with respect to the orbited body 144.

When the space object 140 orbits the body 144, the extended tether 156 crosses the magnetic field 148, which induces a voltage $V_T$ along the length of the tether 156. With an electrical connection to the surrounding plasma, the voltage $V_T$ can drive a current $I_T$ along the tether 156. In accordance with the principles of the invention, the orbit control module 160, comprising one or more charge-emitting devices, provides the electrical connection to the plasma 6. As shown, the orbit control module 160 can establish the electrical connection to the plasma 6 at any point of the tether system. In particular, electrical connection to the plasma 6 can be at either or both endpoints of the tether system or, more generally, electrical connection to the plasma 6 can be made at distributed points along the tether system. The placement of electrical contact points is the subject of tradeoffs in the system design of the particular tether system, and would be understood by one skilled in the art of electrodynamic tether system design. Where the orbit control module 160 is located also depends upon whether the objective is to raise or lower the orbit and whether the module 160 is emitting negative or positive charge.

The current $I_T$ flowing along the tether 156 interacts with the magnetic field 148 of the orbited body 144 and creates a force that modifies the motion of the tether 156. When currents are allowed to flow naturally without any power supply, the direction of the force has a component that is opposite to the velocity of the tether. This causes drag on the tether 156 and reduces the orbit of space object 140. When a power source is available to drive the tether current in a direction opposite to that in which the current wants to flow naturally, the tether 156 pushes against the magnetic field 148 of the orbited body 144, and consequently raises the orbit of the space object 140. Other details regarding electrodynamic tether operation are described in "Review of Electrodynamic Tethers for Space Plasma Science" by P. M. Banks, published by the Journal of Spacecraft and Rockets, Vol. 26, No. 5, pp. 234–239, 1989, and incorporated by reference herein.

The location of the orbit control module 160, the polarity of the emitted charge, the orbital direction of the space object 140 around orbited body 144, and the radial orientation of the tether 156 contribute to determine whether the emission of charge into the plasma results in raising or lowering the orbit of the space object 140. For example, if the space object 140 is moving eastward through the magnetic field 148, and the tether 156 extends toward the orbited body 144, placing the orbit control module 160 on the end-body 164 and emitting electrons into the plasma 6 in the direction in which the electron current $I^T$ wants to flow naturally, i.e., down the tether 156, and away from the space object 140, creates a drag on the tether 156, and the orbit of the space object 140 decreases. If instead power is supplied to enable the orbit control module 160 to emit positive charge, the resulting current opposes the natural direction of flow, and the orbit of the space object 140 increases. Also, if power is supplied so that the orbit control module emits electrons from the space object 140, instead of from the deployed end body 164, again the resulting current opposes the natural direction of flow, and the orbit of the space object 140 increases.

Figure 14:
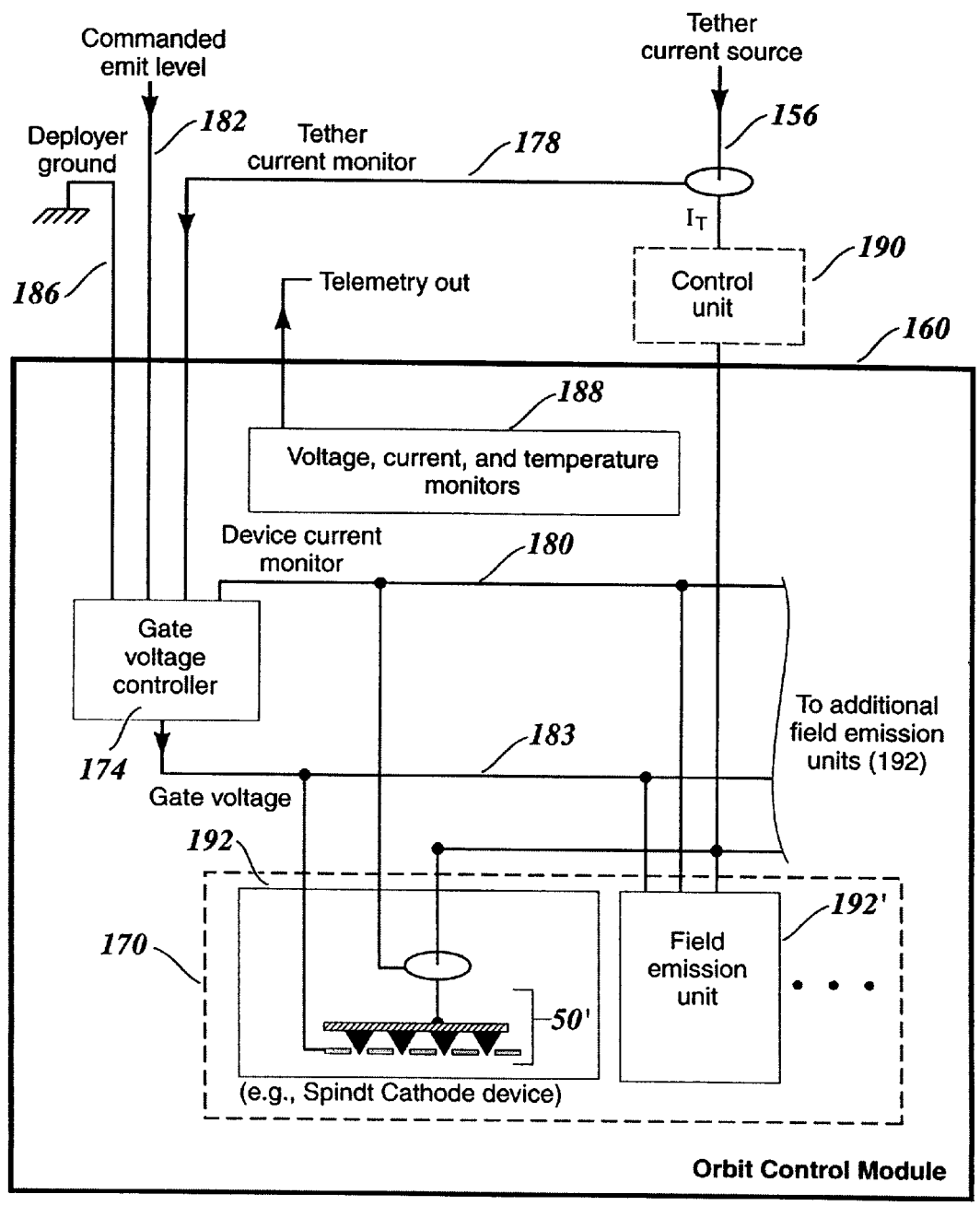
FIG. 14 is an embodiment of the orbit control module of FIG. 13 including a plurality of field emission units; sand

FIG. 14 shows an embodiment of the orbit control module 160 that includes a set 170 of field emission units 192, 192' (generally 192) for emitting electrical current received from the tether 156 into the surrounding plasma environment 6. Each field emission unit 192 includes a field emission device 50' that can be configured in either the gate-grounded mode described in FIG. 9 or the emitter-grounded mode described in FIG. 10. The orbit control 160 also includes a gate voltage controller 174 for monitoring and controlling the flow of electrons from each field emission unit according to ground control inputs or preprogrammed constraints. The gate voltage controller 174 includes a tether current monitor input 178 for monitoring the amount of tether current $I_T$ flowing along the tether 156, a device current monitor input 180 for monitoring the current emitted by each field emission unit 192 in the set 170 of field emission units 192, and a telemetry input 182. The gate voltage controller 174 also has a connection 186 to the electrical ground of the space object 140 (or the end-body 164). The gate voltage controller 174 also has an output 183 for applying a gate voltage to each of the field emission units 192, to control the emission of electrons from the field emission units 192.

Over the telemetry input 182, the gate voltage controller 174 receives a command indicating the desired emission current level. The gate voltage controller 174 also receives a measure of the tether current $I_T$ and the emitter current from the tether current monitor 178 and the device current monitor 180 inputs, respectively. The gate voltage controller 174 then compares the measured emitter current to the measured tether current and the commanded emission current level, and if necessary, adjusts the gate voltage across all field emission devices 50' until the net emitted current equals the commanded emission current level. From the measured tether current, the gate voltage controller 174 ensures that the emission current level does not exceed the amount of current provided by the tether. In those embodiments where some tether current is used to power other components of the system, the gate voltage controller 174 ensures that the emission current level does not exceed the fraction of tether current that is not used elsewhere in the system.

In one embodiment, the set 170 includes ten field emission units 192. Other embodiments can use more or fewer than ten field emission units 192. Different current limit settings are allowed for individual field-emission units 192 in the module 160. The different current limit settings enable different device types to be used in the same orbit control module 160. Further, the different current limits provide robustness because devices of the same type can be protected at different current limits. For further robustness, each field emission unit 192 in the orbit control module 160 can be capable of emitting the maximum current specified by the requirements of the orbit control module 160. In one embodiment, the maximum current specified is 1 ampere, and each field emission unit 192 alone can supply the required amount. Thus, this embodiment provides a 10 to 1 redundancy for the electron field emitting units 192.

In one embodiment, the orbit control module 160 is directly connected to the electrodynamic tether 156 so that the full EMF and tether current $I_T$ are available to the module 160. A small amount the current can be diverted to provide power for the gate voltage controller 174 and monitoring electronics 188. Most of the current is delivered to the field emission units 192, which would then deliver the current to the surrounding plasma environment 6.

In another embodiment, shown in shadow, a control unit 190 is placed between the orbit control module 160 and the tether 156, rather than the module 160 being connected directly to the tether 156. In this case, the orbit control module 160 receives the tether current and control signals from the control unit 190. Although the orbit control module 160 is no longer powered directly by the tether current $I_T$, the control unit 190 can take advantage of the tether power to supplement the electrical power to other components at the end body 164 such as the deployer mechanism and other control systems.

Ground control or an appropriate space object signal activates the tether deployment and the orbit control module 160 when adjustment of the orbit is desired. In one embodiment, the orbit control module 160 becomes active as soon as the deployment of the tether 156 results in a sufficient EMF to power the control electronics. Then, the orbit control module 160 can begin to emit tether current as soon as the EMF is sufficient to power the field emission units 192, or when a preset trigger condition occurs, or when a particular signal is received from ground control. In one embodiment, the current emitted by the field emission units 192 is controlled by use of the telemetry input 182 called "emit level," which can be, for example, a 0 volt to 10 volt signal.

Figure 15:
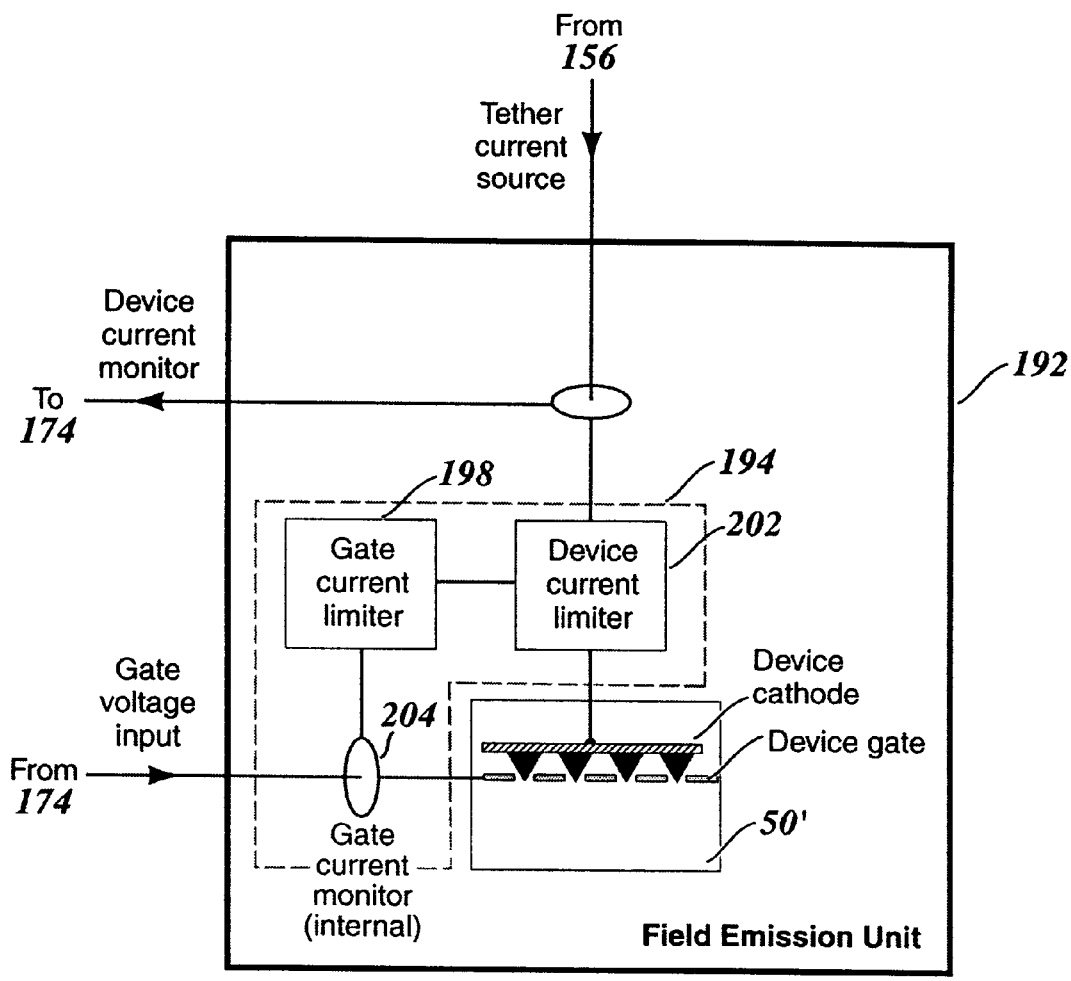
FIG. 15 is a block diagram of an embodiment of an individual field emission unit having a local controller in communication with a field emission device.

FIG. 15 shows an embodiment of an individual field emission unit 192 having a local controller 194 in communication with the field emission device 50'. This individual field emission device 50' is representative of each field emission device included within the field emission units 192 shown in FIG. 14. The local controller 194 includes gate current limiting circuitry 198, device current limiting circuitry 202, and a gate current monitor 204. The local controller 194 can be implemented in analog circuitry to provide fast, low power circuitry that performs reliably when exposed to radiation of a space plasma environment 6. Because no two field emission devices 50' have identical emission characteristics, individual devices 50' might output different currents for the same applied gate voltage. The local controller 194 prevents an individual field emission device 50' from exceeding predefined emission specifications by means of the device current limiting circuitry 202. Further, the gate current limiting circuitry 198 protects the device 50' from runaway emission by limiting emission such that the device gate current remains below a predefined threshold.

Accordingly, in the embodiment the control of emission current from the orbit control module 160 occurs in two levels. At a first level, the gate voltage controller 174 controls the total current output of the orbit control module 160. At a second level, the local controller 194 controls the current output of each individual field emission device 50' to ensure device integrity and to prevent runaway emission at the individual device 50'. This two level design allows each device to be protected or operated within a safe range, while allowing the design of the gate voltage controller 174 to be independent of the field emission unit 192 types or groupings within a particular orbit control module 160.

In one embodiment, the field emission device 50' is a Spindt cathode device, as described above. Spindt cathode devices perform well if baked out in a clean environment before being used for emission of large currents. A slow turn-on and test phase may be necessary before the orbit control module 160 can be used to generate large orbit changing currents. Also, Spindt cathode devices may be operated continuously or by cycling such devices over a range of output levels to change orbit adjustment rate.

While the invention has been shown and described with reference to specific preferred embodiments, it should be understood by those skilled in the art that various changes in form and detail may be made therein without departing from the spirit and scope of the invention as defined by the following claims. For example, although the described embodiments for adjusting the orbit of space objects use electrodynamic tethers, other mechanisms capable of converting kinetic energy to electrical energy can be used in conjunction with the orbit control module to practice the principles of the invention.

What is claimed is:

1. A sensor for measuring an electrical potential difference, comprising:
    a charge-emitting device situated in an environment and having an emitter and a gate;
    a voltage source applying a voltage across the gate and the emitter to induce current to flow from the emitter to said environment and said gate; and
    a control system, in communication with the charge-emitting device, obtaining measurements of the current flowing from the emitter and of current flowing to the gate and determining an electrical potential difference between the charge-emitting device and the environment from the gate current and emitter current measurements.

2. The sensor of claim 1 wherein the control system comprises a processor that determines the electrical potential difference between the charge-emitting device and the environment from a functional relationship between the gate and emission current measurements.

3. The sensor of claim 1 further comprising a table storing correspondences between a functional relationship of the gate and emitter currents and electrical potential differences of the charge-emitting device with respect to the environment.

4. The sensor of claim 1 wherein the control system comprises a voltage controller in communication with the voltage source to control the voltage applied by the voltage source between the gate and the emitter, the voltage controller altering the flow of current from the emitter by adjusting the applied voltage so as to maintain the electrical potential difference between the charge-emitting device and the environment at a predetermined voltage.

5. The sensor of claim 1 wherein the charge-emitting device is electrically connected to an object, and the electrical potential difference measured by the control system corresponds to an electrical potential difference of the object with respect to the environment.

6. The sensor of claim 1 wherein the magnitude of the applied voltage is less than 100 volts.

7. The sensor of claim 1 wherein the charge-emitting device is micro-fabricated.

8. The sensor of claim 1 wherein the gate and the emitter have a spatial relationship that facilitates the determination of the electrical potential difference between the charge-emitting device and the external environment of the charge-emitting device.

9. The sensor of claim 8 wherein the spatial relationship of the gate and emitter induces at least a predetermined amount of current to flow to the gate.

10. A sensor for measuring an electrical potential difference of a space object with respect to an environment of the space object, comprising:

a charge-emitting device situated in an environment and having an emitter and a gate;

a voltage source applying a voltage across the gate and the emitter to induce current to flow from the emitter to said environment and said gate;

a first current monitor in communication with the emitter to measure current flowing from the emitter in response to the applied voltage;

a second current monitor in communication with the gate to measure current flowing to the gate; and a control system in communication with the voltage source and current monitors to determine an electrical potential difference between the charge-emitting device and the environment from the gate and emitter current measurements.

11. A controller for controlling an electrical potential difference of a space object with respect to an environment of the space object, comprising:

a charge-emitting device having at least two terminals and being electrically connected to an external surface of the space object;

a voltage source applying a voltage across two terminals of the charge-emitting device to induce current obtained from the space object to flow from one of the terminals into the environment of the space object; and a control system measuring an electrical potential difference between the charge-emitting device and the environment of the space object based on measurements of currents flowing through the two terminals, and altering the flow of the current from the emitting terminal by adjusting the applied voltage so as to control that electrical potential difference.

12. A method for measuring an electrical potential difference, comprising:

applying a voltage across a gate and an emitter of a charge-emitting device situated in an environment to induce current to flow from the emitter to said environment and said gate; and obtaining measurements of the emitter current flowing from the emitter and of current flowing to the gate; and determining an electrical potential difference between the charge-emitting device and the environment from the measured gate and emitter currents.

13. The method of claim 12 wherein the determining of the electrical potential difference between the charge-emitting device and the environment of the charge-emitting device includes computing a functional relationship of the measured gate and emission currents.

14. The method of claim 12 further comprising developing associations between functional relationships of the gate and emitter currents with electrical potential differences between the charge-emitting device and the environment.

15. The method of claim 12 further comprising adjusting the applied voltage to adjust the emitter current and maintain the electrical potential difference between the charge-emitting device and the environment at a predetermined voltage.

16. The method of claim 12 further comprising electrically connecting the charge-emitting device to an object, and wherein the determined electrical potential difference corresponds to an electrical potential difference of the object with respect to the environment.

17. The method of claim 12 further comprising configuring a geometry of the gate with respect to a geometry of the emitter to facilitate the determination of the electrical potential difference between the charge-emitting device and the environment.

18. The method of claim 17 wherein the configured geometries of the gate and emitter induce at least a predetermined amount of current to flow to the gate.

19. A method for sensing and controlling an electrical potential difference of a space object with respect to an environment of the space object, comprising:

electrically connecting an at least two-terminal charge-emitting device to an external surface of the space object;

applying a voltage across two terminals of the charge-emitting device to induce charge obtained from the space object to flow from one of the terminals into the environment of the space object;

measuring an electrical potential difference between the charge-emitting device and the environment of the space object based on currents that are measured in response to the applied voltage; and altering the flow of the charge from the emitting terminal by adjusting the applied voltage, to control the electrical potential difference between the space object and the environment of the space object.

20. A sensor for measuring an electrical potential difference, comprising:

a charge-emitting device situated in an environment and having an emitter and a gate;

a voltage source applying a voltage across the gate and the emitter to induce current to flow from the emitter;

a control system, in communication with the charge-emitting device, obtaining measurements of the current flowing from the emitter and of current flowing to the gate and determining an electrical potential difference between the charge-emitting device and the environment from the gate current and emitter current measurements; and a table stoning correspondences between a functional relationship of the gate and emitter currents and electrical potential differences of the charge-emitting device with respect to the environment.

21. A sensor for measuring an electrical potential difference, comprising:

a charge-emitting device situated in an environment and having an emitter and a gate;

a voltage source applying a voltage across the gate and the emitter to induce current to flow from the emitter;

a control system, in communication with the charge-emitting device, obtaining measurements of the current flowing from the emitter and of current flowing to the gate and determining an electrical potential difference between the charge-emitting device and the environment from the gate current and emitter current measurements, wherein the control system comprises a voltage controller in communication with the voltage source to control the voltage applied by the voltage source between the gate and the emitter, the voltage controller altering the flow of current from the emitter by adjusting the applied voltage so as to maintain the electrical potential difference between the charge-emitting device and the environment at a predetermined voltage.

22. A sensor for measuring an electrical potential difference, comprising:

a charge-emitting device situated in an environment and having an emitter and a gate;

a voltage source applying a voltage across the gate and the emitter to induce current to flow from the emitter; and a control system, in communication with the charge-emitting device, obtaining measurements of the current flowing from the emitter and of current flowing to the gate and determining an electrical potential difference between the charge-emitting device and the environment from the gate current and emitter current measurements, wherein the charge-emitting device is electrically connected to an object, and the electrical potential difference measured by the control system corresponds to an electrical potential difference of the object with respect to the environment.

23. A method for measuring an electrical potential difference, comprising:

applying a voltage across a gate and an emitter of a charge-emitting device situated in an environment to induce current to flow from the emitter, obtaining measurements of the emitter current flowing from the emitter and of current flowing to the gate; and determining an electrical potential difference between the charge-emitting device and the environment from the measured gate and emitter currents, wherein the determining of the electrical potential difference between the charge-emitting device and the environment of the charge-emitting device includes computing a functional relationship of the measured gate and emission currents.

24. A method for measuring an electrical potential difference, comprising:

applying a voltage across a gate and an emitter of a charge-emitting device situated in an environment to induce current to flow from the emitter;

obtaining measurements of the emitter current flowing from the emitter and of current flowing to the gate;

determining an electrical potential difference between the charge-emitting device and the environment from the measured gate and emitter currents; and developing associations between functional relationships of the gate and emitter currents with electrical potential differences between the charge-emitting device and the environment.

25. A method for measuring an electrical potential difference, comprising:

applying a voltage across a gate and an emitter of a charge-emitting device situated in an environment to induce current to flow from the emitter;

obtaining measurements of the emitter current flowing from the emitter and of current flowing to the gate;

determining an electrical potential difference between the charge-emitting device and the environment from the measured gate and emitter currents; and configuring a geometry of the gate with respect to a geometry of the emitter to facilitate the determination of the electrical potential difference between the charge-emitting device and the environment.

26. The method of claim 25 wherein the configured geometries of the gate and emitter induce at least a predetermined amount of current to flow to the gate.

27. A method for measuring an electrical potential difference, comprising:

applying a voltage across a gate and an emitter of a charge-emitting device situated in an environment to induce current to flow from the emitter;

obtaining measurements of the emitter current flowing from the emitter and of current flowing to the gate;

determining an electrical potential difference between the charge-emitting device and the environment from the measured gate and emitter currents; and adjusting the applied voltage to adjust the emitter current and maintain the electrical potential difference between the charge-emitting device and the environment at a predetermined voltage.

28. A method for measuring an electrical potential difference, comprising:

applying a voltage across a gate and an emitter of a charge-emitting device situated in an environment to induce current to flow from the emitter;

obtaining measurements of the emitter current flowing from the emitter and of current flowing to the gate;

determining an electrical potential difference between the charge-emitting device and the environment from the measured gate and emitter currents; and electrically connecting the charge-emitting device to an object, and wherein the determined electrical potential difference corresponds to an electrical potential difference of the object with respect to the environment.

* * * * *

UNITED STATES PATENT AND TRADEMARK OFFICE
CERTIFICATE OF CORRECTION

PATENT NO. : 6,577,130 B1
DATED : June 10, 2003
INVENTOR(S) : Richard Cosmo Adamo and Victor Manuel Aguero It is certified that error appears in the above-identified patent and that said Letters Patent is hereby corrected as shown below:

<u>Title page,</u>
Item [56], References Cited, U.S. PATENT DOCUMENTS,
Please add:

| | | |
|---|---|---|
| -- 4,571,726 A | 2/1986 | Wortman et al ......... 315/3.6 |
| 5,679,895 A | 10/1997 | von Windheim ......... 313/336 |
| 4,800,281 A | 1/1989 | Williamson ............ 250/423R |
| 5,186,670 A | 2/1993 | Doan et al ............. 445/24 |
| 5,594,325 A | 1/1997 | Manner ................. 323/282 |
| 6,362,574 A | 3/2002 | Aguero et al ............ 244/158R -- |

Item [57], ABSTRACT,
Line 7, please change "emitter terminal A" to -- emitter terminal. A --.

<u>Column 4,</u>
Line 26, please change "sand" to -- and --.

<u>Column 6,</u>
Line 40, please change "$10^2$" to -- $10^7$ --.

Signed and Sealed this

Twenty-first Day of October, 2003

JAMES E. ROGAN
*Director of the United States Patent and Trademark Office*